United States Patent
Krylov et al.

(10) Patent No.: US 7,177,063 B2
(45) Date of Patent: Feb. 13, 2007

(54) BOUNCING MODE OPERATED SCANNING MICRO-MIRROR

(75) Inventors: Slava Krylov, Holon (IL); Moshe Medina, Haifa (IL); Avigdor Huber, Yehud (IL); Ronen Lalezar, Rishon Lezion (IL)

(73) Assignee: Terraop Ltd., Kfar Saba (IL)

( * ) Notice: Subject to any disclaimer, the term of this patent is extended or adjusted under 35 U.S.C. 154(b) by 0 days.

(21) Appl. No.: 11/144,842

(22) Filed: Jun. 6, 2005

(65) Prior Publication Data

US 2005/0219677 A1    Oct. 6, 2005

Related U.S. Application Data

(63) Continuation-in-part of application No. 10/902,869, filed on Aug. 2, 2004, now Pat. No. 7,042,613.

(60) Provisional application No. 60/575,248, filed on Jun. 1, 2004, provisional application No. 60/550,850, filed on Mar. 8, 2004, provisional application No. 60/494,353, filed on Aug. 12, 2003.

(51) Int. Cl.
   *G02F 1/01* (2006.01)
(52) U.S. Cl. ............... 359/245; 359/290; 359/291
(58) Field of Classification Search ............... 359/245, 359/291, 290, 223, 224, 230, 877, 214, 871, 359/872; 345/108
See application file for complete search history.

(56) References Cited

U.S. PATENT DOCUMENTS 6,817,725 B2 * 11/2004 Mizuno et al. ............. 359/877

2004/0141894 A1 * 7/2004 Mizuno et al. ............. 422/201

OTHER PUBLICATIONS

"Design and fabrication of scanning mirror for laser display" H. Lee et al, *Sensors and Actuators A-Physical* 96 (2-3) pp. 223-230, 2002.
"Tuning the dynamic behavior of parametric resonance in a micromechanical oscillator" W Zhang et al, *Applied Physics Letters* 82(1) pp. 130-132, 2003.
"Optical Characterization of High Speed Scanning Micromirrors with Vertical Combdrives" H. Wada et al, *Jpn. J. Appl. Phys.* 41 (10B) pp. 1169-1171, 2002.
"A reasonatly excited 2D-micro-scanning-mirror with large deflection" H Schenk et al, *Sensors and Actuators A-Physical* 89 (1-2) pp. 104-111, 2001.
"Design and Analysis of a micro-scanning mirror" I. Bucher, in *Proc. of 29th Israel Conference on Mechanical Engineering*, May 12-13, 2003, Technion, Haifa, Israel.

(Continued)

*Primary Examiner*—Timothy Thompson
(74) *Attorney, Agent, or Firm*—Mark M. Friedman

(57) ABSTRACT

A MEMS apparatus for scanning an optical beam comprises a mirror operative to perform a rotational motion to a maximum rotation angle around a mirror rotation axis formed in a double active layer silicon-on-insulator (SOI) substrate. The apparatus may include a bouncing mechanism operative to provide a bouncing event and to reverse the rotational motion. The bouncing event provides the mirror with a piecewise linear response to actuation by intrinsically nonlinear electrostatic forces. In a particular embodiment, the bouncing mechanism includes a vertical comb drive stator built in the same active layer of the double active layer SOI substrate, while actuator comb drive stators are built in a different active layer.

20 Claims, 42 Drawing Sheets

OTHER PUBLICATIONS

"Bouncing mode electro-statically actuated scanning micro-mirror for video applications" by V. Krylov and D.I. Barnea, submitted for publication in *Smart Materials and Structures*, Mar. 2004.

"Overview of Light Beam Scanning Technology for Automotive Projection Displays" Lippert et al Microvision Inc, www.mvis.com.

* cited by examiner

FIG. 10
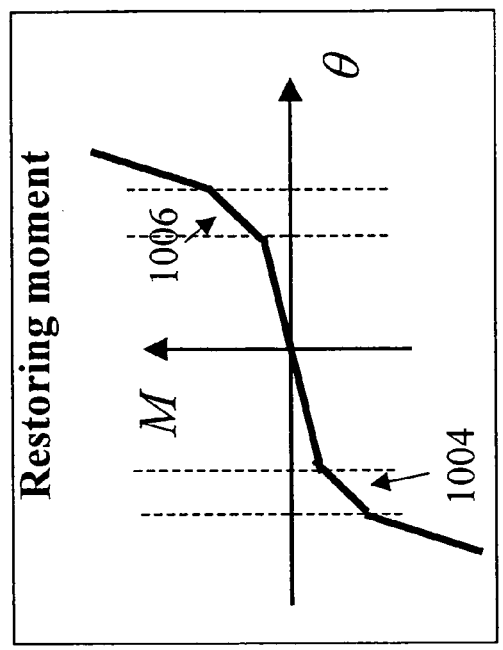
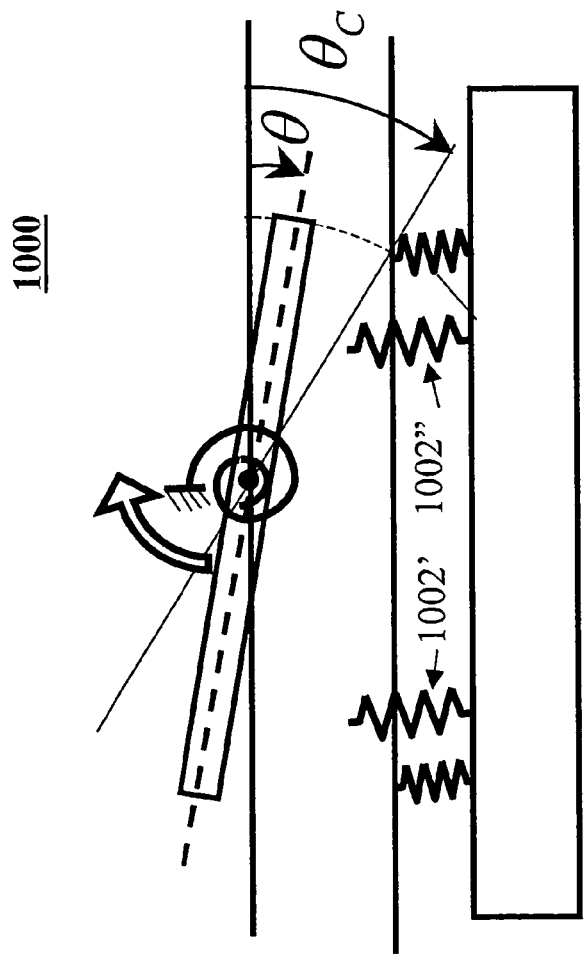

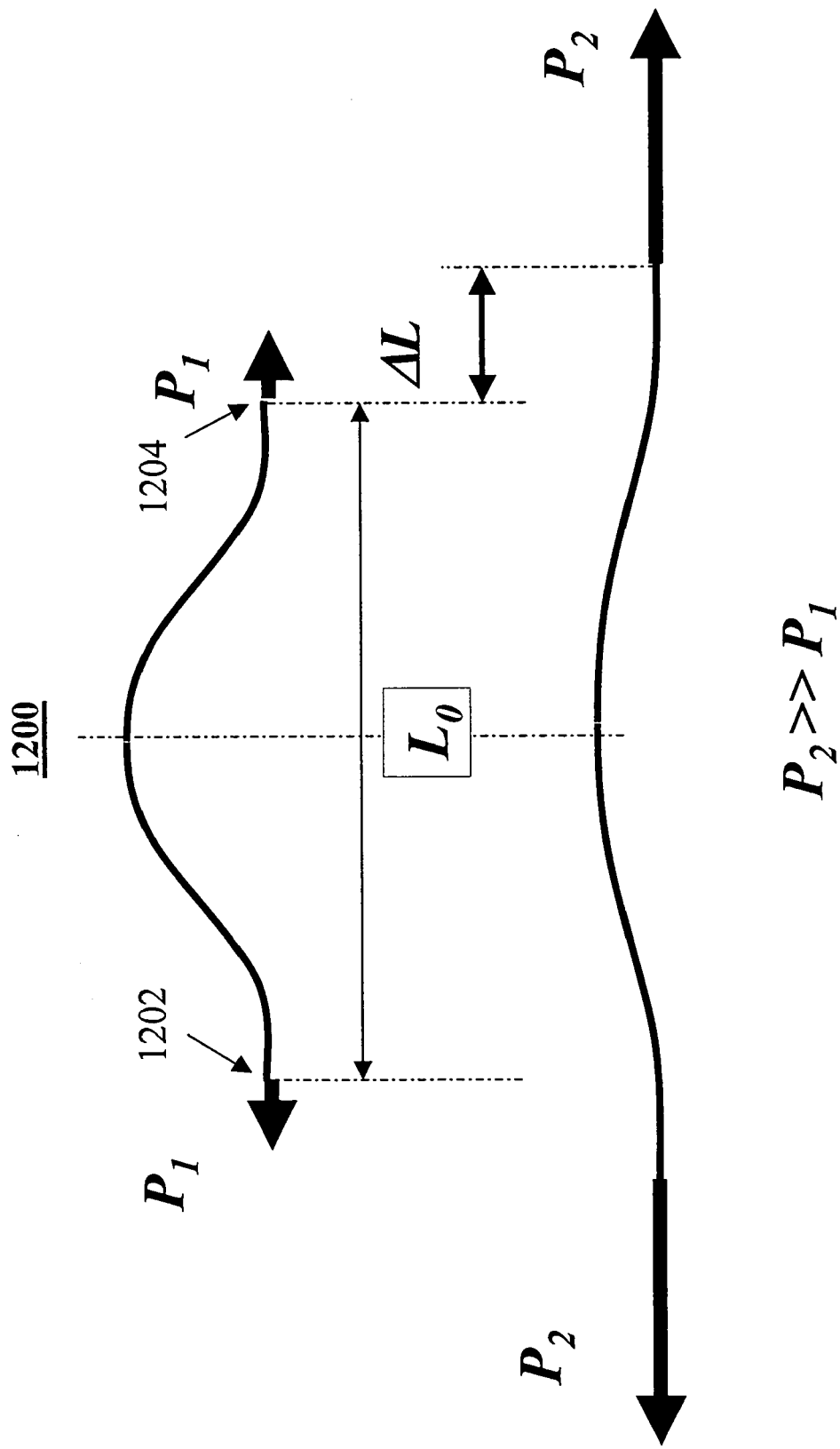

SECTION A-A

SECTION A-A

SECTION A-A

SECTION A-A

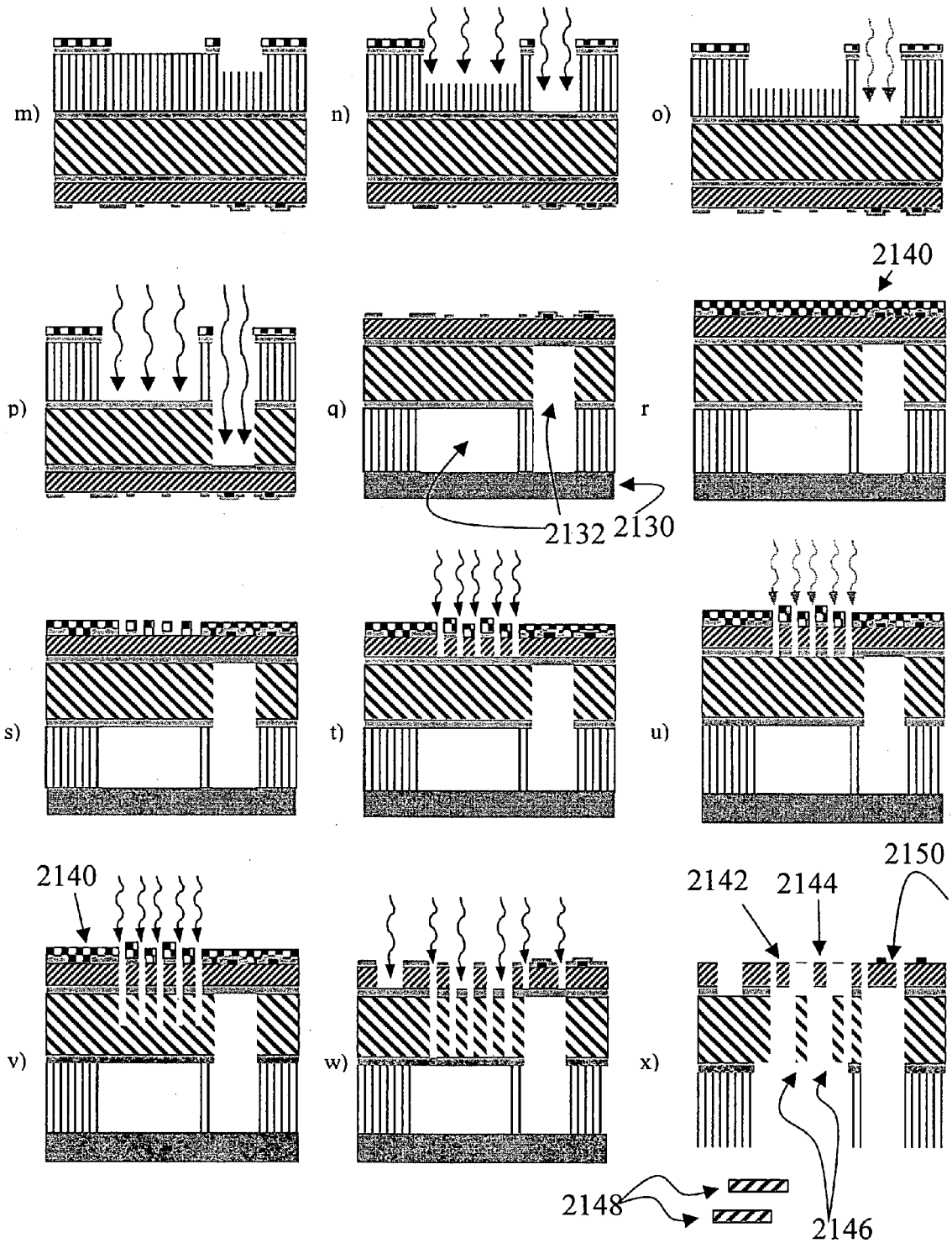

BOUNCING MODE OPERATED SCANNING MICRO-MIRROR

CROSS REFERENCE TO RELATED APPLICATIONS

The present invention is a continuation in part of U.S. patent application Ser. No. 10/902,869 filed Aug. 2, 2004, which claims priority from U.S. Provisional Patent Applications Nos. 60/494,353 filed Aug. 12, 2003, 60/550,850 filed Mar. 8, 2004, and 60/575,248 filed Jun. 1, 2004, the contents of which are incorporated herein by reference.

FIELD OF THE INVENTION

The present invention relates generally to scanning micro-mirrors implemented in Micro Electro Mechanical Systems (MEMS) or Micro Opto Electro Mechanical Systems (MOEMS), and more particularly to tilting micro-mirrors used for scanning.

BACKGROUND OF THE INVENTION

A tilting micro-mirror is a central element in many MEMS or MOEMS devices. When used for scanning, its elements and operation principle are shown in FIG. 1. A tilting micro-mirror (or simply "mirror") 100 comprises a generally flat plate (e.g. made of silicon) that has a reflecting surface 104. Plate 102 is held suspended by two torsional hinges 106' and 106" aligned along a common torsion (and tilt) axis 108. The two hinges render mirror 100 operative to tilt clockwise and counterclockwise around axis 108 in a given range of angles (typically ±5 degrees). A laser beam 110 that impinges on the reflecting surface of the mirror is redirected by the mirror to a scanned area 112. The tilting mirror is actuated by an actuation moment 120 that can be provided by well-known MEMS actuation systems.

FIG. 2 shows the required time dependence of the rotational (or "tilt") angle of a scanning mirror, i.e. the required shapes of a scanning path 202 to be followed by the reflected laser beam on scanned area 112. A triangular signal is needed for the forward-backward scanning, as shown in box 206, while a sawtooth signal 208 is needed for one directional scanning, as shown in box 210. 1>2>3>4>5>6 represent scans in the time domain. In this kind of applications, the necessity to create an image free of spatial and temporal distortions imposes specific requirements on the scanning micro-mirror motion. These include long term frequency stability and constant angular velocity (for small rotations), see J. H. Lee et al, *Sensors and Actuators A-Physical* 96 (2–3) pp. 223–230, 2002. A mirror of this type has been implemented recently in a virtual retinal display, see T. M. Lippert et al, *"Overview of Light Beam Scanning Technology for Automotive Projection Displays"*, available at Microvision Inc.®, http://www.mvis.com/pdfs/sid_auto.pdf.

Tilt mirrors are also used in optical switches and variable optical attenuators implemented in communication systems, and in light processing devices used in projection technology. A large variety of designs and operational modes have been reported, depending on the requirements imposed by the specific application. For example, in optical communication applications, the requirements of long term positioning accuracy combined with high optical quality and low thermal sensitivity are the most challenging. In contrast, micro-mirrors used in projection devices for the digital processing of visible light must fulfill requirements of high reflectivity, short switching time and high reliability, while positioning issues are usually less crucial.

While linear motions are highly desirable in all micro-mirrors, it is difficult to provide it. The difficulty is mainly the consequence of the intrinsic nonlinearity and high level of uncertainty of operational forces developed by MEMS actuators. A large variety of micro-device actuation principles and methods are known. These include electrostatic, magnetic, thermal, piezo, laser and flow-induced actuation, as well as actuation based on shape memory alloys. Electrostatic actuation and magnetic actuation remain the most widely used methods. The main advantage of magnetic actuation is the linear relationship between the input signal (electric current) and the actuation force. However, the price paid is usually a high power consumption resulting in high heat generation, intricacy of the design and relatively complicated fabrication processes. In addition, the scaling laws of magnetic actuators are less favorable that those of electrostatic actuators.

The required typical size of a micro-mirror for scanning application in a retinal display (from hundreds of microns up to a millimeter) and the required operation frequencies (tens of KHz) make electrostatic actuation attractive for this use. In addition, advantages of electrostatic actuation include simple, well-established processes used for the fabrication of electrostatic devices, low power consumption, and developed modeling tools and large variety of design concepts reported in literature. However, the central difficulty of electrostatic actuation is the intrinsic nonlinearity of electrostatic forces. In the case of a scanning mirror, this results in a nonlinear dependence of the actuating torsion moment on the tilting angle and a nonlinear (quadratic) dependence on operational voltage. Moreover, the nonlinearity of electrostatic forces combined with the linearity of elastic restoring mechanical forces lead also to pull-in instability, which limits the operational range of the device.

To overcome these difficulties, different solutions were proposed in prior art. Specifically, a generated square root (of voltage) input signal was used by W Zhang et al, *Applied Physics Letters* 82(1) pp. 130–132, 2003, for the operation of a micro-resonator near the parametric resonance. The use of a vertical comb drive permits the elimination of the actuation moment dependence on the tilting angle and the reduction or even elimination of the square dependence on voltage, see e.g. J H Lee et al, *Sensors and Actuators A-Physical* 96 (2–3) pp. 223–230, 2002, H. Wada et al, *Jpn. J Appl. Phys.* 41 (10B) pp. 1169–1171, 2002, and H Schenk et al, *Sensors and Actuators A-Physical* 89 (1–2) pp. 104–111, 2001. The necessity to provide a triangular signal which is required for video applications leads to very high actuation voltages or, in the case of magnetic actuation, very large currents. This difficulty is not related to the linearity of the motion and it is a result of high angular accelerations during the inversion of the velocity. To overcome this difficulty, frequency, I. Bucher, in *Proc. of 29th Israel Conference on Mechanical Engineering*, May 12–13, 2003, Technion, Haifa, Israel, suggested to represent the required triangular response as a Fourier series of sinusoidal components, and to excite each of these components at the resonance The problems with tall such solutions include high complexity, difficulty to provide resonant frequencies with high accuracy, and consequently high sensitivity to fabrication tolerances and extreme difficulty in tuning the resonant frequency.

There is therefore a widely recognized need for, and it would be highly advantageous to have a scanning micromirror that has optimized motion linearity combined with high operational frequency and low actuation voltages.

SUMMARY OF THE INVENTION

The present invention discloses a tilting "bouncing mode" micro-mirror that uses either an additional stiffness element (also referred to throughout this description as "bouncer") or a pre-curved nonlinear stiffness element to achieve a superior scanning performance. The present invention further discloses a micro-mechanical actuator used to move a member carrying a payload (e.g. a mirror) along an axis in a periodical nonlinear angular trajectory. The present invention further discloses a novel tilting micro-mirror mode of operation that permits the achievement of a piecewise linear response of a micro-mirror device operated by intrinsically nonlinear forces. In one embodiment, the "bouncing mode" of operation according to the present invention includes a contact event between the mirror and an elastic constraint, which takes place each time the mirror reaches a prescribed rotation angle. This contact event is followed by the bouncing of the mirror and by the inversion of the angular motion, hence the name "bouncing mode". In another embodiment, the "bouncing mode" is achieved by the action of pre-curved nonlinear stiffness elements coupled at one end to an actuator and at another end to the mirror. Illustrative examples of bouncing-mode scanning micro-mirrors actuated electrostatically by both parallel-plate electrodes and planar or vertical comb drives are presented in detail. It is shown that in all embodiments, the response frequency can be tuned through the control of the actuation voltage. This feature allows to compensate for uncertainties in the parameters of micro-fabricated devices and to synchronize the response frequency with a precision sufficient for video applications. The resonant-mode operation and the application of actuation forces during the contact event, when the mirror is close to the electrode (in the bouncer plus parallel plate actuation example), enable operation at extremely low power and voltages and provide a compact and low cost actuator. Additional improvements in linearity may be achieved through the application of a correction voltage during the mirror motion between bouncing events.

In essence, the present invention uses a bouncer or a nonlinear stiffness element in a similar manner to a nonlinear oscillator, specifically to an impact oscillator, for the shaping of an output signal. While impact oscillators incorporating bouncing are known and intensively studied in the nonlinear dynamics literature, the use of a bouncer or a pre-curved nonlinear stiffness element as disclosed herein and for the purposes set forth herein is unknown.

Advantageously, in the bouncing mode using bouncers disclosed herein, the actuation forces can be applied either to the mirror (passive barrier) or directly to the bouncer (active barrier). Note that in many MEMS applications, a typical situation exists in which the structure of the micro-device is linear mechanically, and nonlinearity arises only due to actuation forces. For example, in the case of a scanning mirror the stiffness of the torsion axis is constant. As a result, the motion of the mirror in the absence of actuation forces during the time interval between bouncing events is actually a free motion of a linear system. The angular velocity of such a motion depends on the initial conditions defining the initial kinetic and potential energy of the system and on the stiffness of the torsion spring. In the case when the kinetic energy is the dominant part of the total energy of the system, the variation of the velocity during the free motion is minor and a desirable level of the linearity of motion is achievable. This situation is realizable when the stiffness of the torsion spring is small compared with the stiffness of the barrier.

Other important advantages of the devices and methods disclosed herein include low sensitivity of the frequency and shape of the output signal to the system parameters, and good controllability of frequency. These advantages arise from the fact that the frequency of the mirror is defined by the deformation of the barrier, which for its part depends on the level of the energy supplied during each bouncing event. Viscous losses during the free motion, as well as uncertainties in the system parameters, can be easily compensated by controlling this energy supplement through the actuation voltage. Note that the uncertainty in the resonance frequency of the mirror can be critical, as mentioned in H. Wada et al. above, who reported a discrepancy of 25–30% between calculated and measured values. This ability to tune the natural frequency using the actuation voltage permits long-term stabilization of the response frequency and precise synchronization of the mirror motion with a video input.

According to the present invention there is provided a MEMS apparatus for scanning an optical beam comprising a mirror operative to perform a rotational motion to a maximum rotation angle around a mirror rotation axis, and a bouncing mechanism operative to provide a bouncing event and to reverse the rotational motion, wherein the bouncing mechanism includes at least one first comb drive stator, whereby the bouncing event provides the mirror with a piecewise linear response to actuation by intrinsically nonlinear forces.

According to the present invention, the MEMS apparatus for scanning an optical beam further comprises an actuator operative to provide the actuation, the actuator connected to a substrate.

According to one feature in the MEMS apparatus for scanning an optical beam of the present invention, the actuator includes a vertical comb drive actuator having at least one second comb drive stator in a different plane than a plane of the first comb drive stator.

According to another feature in the MEMS apparatus for scanning an optical beam of the present invention, the substrate includes a double active layer silicon on insulator (SOI) substrate, wherein each first comb drive stator is fabricated in a different active layer than each second comb drive stator.

According to yet another feature in the MEMS apparatus for scanning an optical beam of the present invention, the vertical comb drive actuator includes at least one rotor co-planar with and rigidly connected to the mirror.

According to the present invention there is provided a MEMS apparatus for scanning an optical beam comprising a mirror operative to perform a tilting motion to a maximum tilting angle around a mirror rotation axis, the apparatus formed in a double active layer SOI substrate.

According to the present invention, the MEMS apparatus for scanning an optical beam further comprises a vertical comb drive actuator operative to provide the tilting motion.

According to another feature in the MEMS apparatus for scanning an optical beam of the present invention, the vertical comb drive includes at least one rotor co-planar with and rigidly connected to the mirror in one active layer, and at least one stator formed in a different active layer.

According to the present invention, the MEMS apparatus for scanning an optical beam further comprises at least a pair of springs connecting the mirror on opposite sides to the substrate.

According to another feature in the MEMS apparatus for scanning an optical beam of the present invention, the active layer in which the mirror and the at least one rotor are formed is a top active layer of the SOI substrate, and wherein the different active layer in which the at least one stator is formed is a bottom active layer of the SOI substrate.

According to the present invention there is provided a tilting micro-mirror formed in a double active layer SOI substrate and actuated by a vertical comb drive formed in the same substrate.

According to one feature in the tilting micro-mirror of the present invention, the vertical comb drive includes at least one rotor formed in one active layer of the SOI substrate and at least one stator formed in another active layer of the SOI substrate.

According to another feature in the tilting micro-mirror of the present invention, mirror is formed in the same active layer as the at least one rotor.

According to the present invention there is provided a method for controlling the path of a light beam reflected by a reflecting element formed in a double active layer SOI substrate, the method comprising the steps of providing at least one vertical comb drive formed in the SOI substrate, and using the at least one vertical comb drive to tilt the reflecting element, thereby controlling the light beam path.

According to one feature in the method of the present invention, the step of providing at least one vertical comb drive formed in the double active layer silicon-on-insulator (SOI) substrate includes providing at least one movable comb drive element rigidly connected to the reflecting element and formed in one active layer, and providing at least one stationary comb drive element formed in a different active layer, the movable and stationary comb drive elements being electrostatically actuated to provide the tilt.

According to the present invention, the method further comprises the step of providing at least one additional stationary comb drive element formed in the same active layer as the mirror and the movable comb drive element, the at least one additional stationary comb drive element operative to provide a bouncing event to the reflective element.

According to another feature in the method of the present invention, the providing of at least one movable comb drive element rigidly connected to the reflecting element and formed in one active layer includes forming the at least one movable comb drive element, the reflecting element and the at least one additional stationary comb drive element in a top active layer of the SOI substrate.

BRIEF DESCRIPTION OF THE DRAWINGS

Reference will be made in detail to preferred embodiments of the invention, examples of which may be illustrated in the accompanying figures. The figures are intended to be illustrative, not limiting. Although the invention is generally described in the context of these preferred embodiments, it should be understood that it is not intended to limit the spirit and scope of the invention to these particular embodiments. The structure, operation, and advantages of the present preferred embodiment of the invention will become further apparent upon consideration of the following description, taken in conjunction with the accompanying figures, wherein:

FIG. 10 shows schematically yet another embodiment of a bouncing mode micro-mirror device with a pair of additional softer bouncers connected to the substrate;

FIG. 12a shows schematically a pre-curved nonlinear stiffness element that may be advantageously used in the bouncing micro-mirror devices of the present invention;

FIG. 12b illustrates the dependence between the applied force and the elongation of the nonlinear stiffness element of FIG. 12a;

DETAILED DESCRIPTION OF THE PREFERRED EMBODIMENTS

Figure 1:
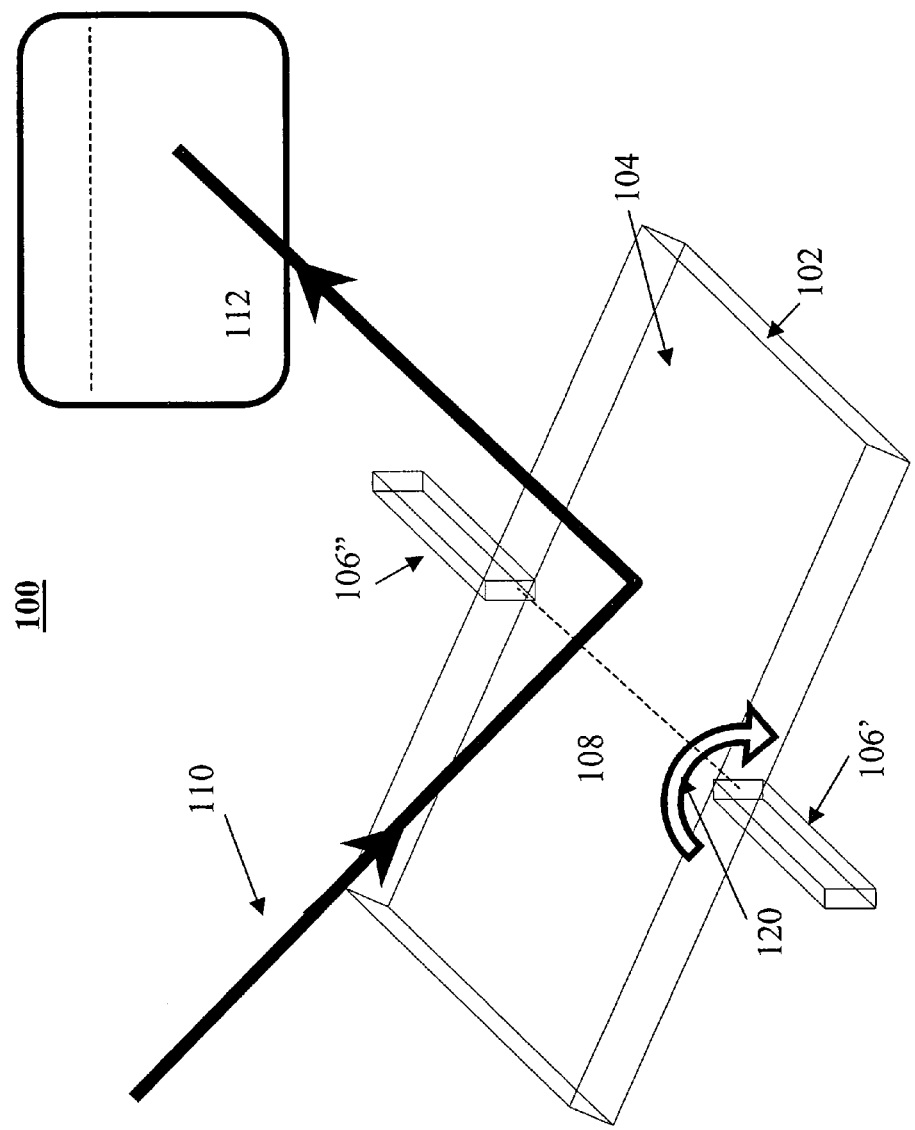
FIG. 1 shows the elements and operation principle of a tilting micro-mirror used for scanning.
Figure 2:
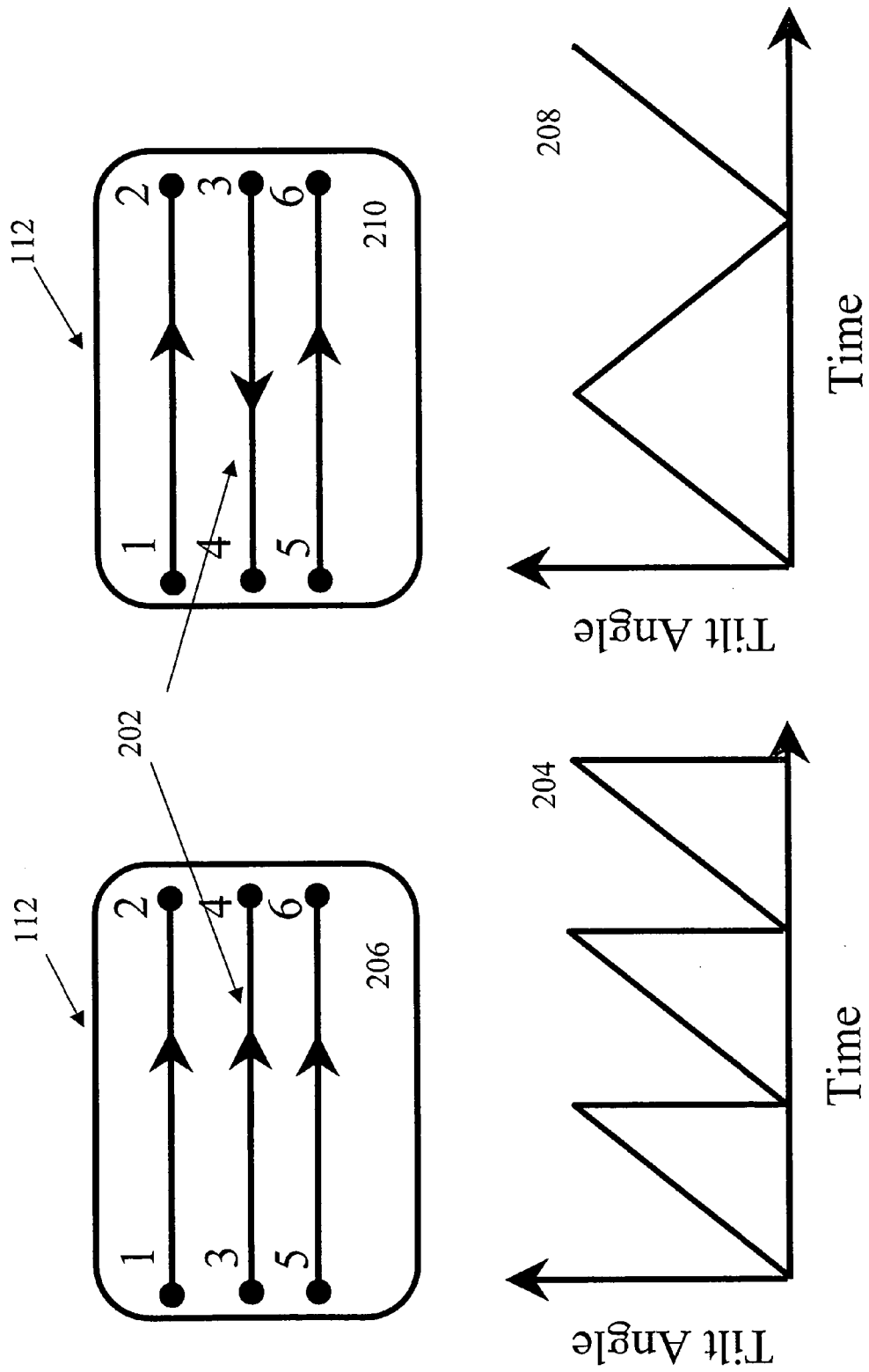
FIG. 2 shows the required time dependence of the rotational angle of a scanning mirror.

The present invention discloses a tilting bouncing mode micro-mirror that uses either an additional stiffness element ("bouncer") or a pre-curved nonlinear stiffness element to achieve a superior scanning performance. While a bouncer such as a cantilever or beam is an element with linear stiffness, we have found inventively and advantageously that its cooperative action with other elements of the system (specifically a torsion spring) that have a different stiffness yields a combined "nonlinear stiffness element" effect. The bouncing mode uses an actuation operation mode based on a special nonlinear actuation and control principle. The "bouncing-mode" actuator that actuates the mirror is operated in the self-exciting mode and its motion is actually a limit cycle. The actuator moves the mirror in a piecewise linear trajectory. The nonlinear actuation and control principle provides a set of desirable features such as small size and weight, low power and low heat dissipation, high frequency cycle with fine and accurate feedback controllability, quasi-linear trajectory intervals, low acoustical noise and more. A full description of the theory and simulations that describe the nonlinear actuation and control that provide the bouncing mode of the present invention may be found in "Bouncing mode electrostatically actuated scanning micromirror for video applications" by V. Krylov and D. I. Barnea, submitted for publication in *Smart Materials and Structures*, March 2004, which is incorporated by reference for all purposes set forth herein.

The invention makes use of loop-shaping methods based on the utilization of the properties of a nonlinear resonator. The method permits the shaping of an output signal to a required form (for example to a triangular or saw tooth form) from another shape of an input signal (for example sinusoidal or rectangular).

The motion of a generic nonlinear oscillator, excited for example by a sinusoidal signal, can be described by the equation:

$$\ddot{\theta} + c\dot{\theta} + \sum_k \varepsilon_k \theta^k = A\sin(\omega t) \quad (1)$$

where $\theta$, $\dot{\theta}$ and $\ddot{\theta}$ are respectively the angle and its first and second time derivatives, c and A are constants, $\omega$ is the frequency, t is time, and $\varepsilon_k$ represents parameters of nonlinearity. Since the equation is nonlinear, the periodic output signal (if is exists) is not sinusoidal and contains higher harmonics:

$$\theta = \sum_k a_k \sin(k\omega t) + b_k \cos(k\omega t) \quad (2)$$

The parameters of nonlinearity $\varepsilon_k$ can be chosen in such a way that the parameters defining the shape of the output signal, namely $a_k$, $b_k$ take the values resulting in the required shape of the output signal. Tuning of the resonant frequency is possible as well, due to the nonlinearity of the system. A transducer of this type has an advantage of compactness, since it is based on a single element.

Formation of the image free of distortions imposes specific requirements on the angular velocity of the scanning device. More specifically, the angle-time dependence should be as close as possible to triangular or saw tooth signal. In other words, the angular velocity should be piecewise constant. The inversion of angular velocity, i.e., change of its sign at the end of each half period, involves very high angular accelerations. The simplest equation of motion of the tilting device (considered, for simplicity, spring-less) is as follows $$I\frac{d^2\theta}{dt^2} = M(t) \quad (3)$$

where $\theta(t)$ is tilting angle, t is time, I is moment of inertia and M(t) is externally applied actuating moment. If we integrate this equation within the time interval $[t_1,t_2]$, where $t_1$ is the time before velocity inversion and $t_2$ is the time after the inversion, and obtain $$H_2 - H_1 = \int_{t_1}^{t_2} M(t)\,dt \quad (4)$$

where $H=I\frac{d\theta}{dt}$ is angular momentum. Since the angular velocity is constant before and after inversion, the change in the angular momentum is independent on $t_1$ and $t_2$. In the case in which $H_2=-H_1$, $\Delta H=2H_1$, the inversion of the velocity can be viewed as an elastic bouncing event without loss of energy. If $|H_2|<|H_1|$, the inversion of velocity is accompanied by losses and can be viewed as a plastic collision. Note that since we are looking for periodic motion, in our case the bouncing should be elastic. One observes that the change in momentum is equal to the integral in the right hand side of the equation. If the moment is applied in such a way that the integral is equal to the change of momentum, the periodic motion is sustained. The moment can be applied during a very short time (pulse-like). In this case, the moment itself should be large. Alternatively, lower moment can be applied during a longer time. The longest admissible time for the application of the moment and therefore the lowest admissible moment are imposed by system requirements.

In order to provide effective velocity inversion, the application of the moment should be synchronized with the motion of the mirror. In the case in which the simplest position control is used, the moment is applied when the mirror reaches a certain angle. In this case this, the control moment is a function of the angle and not a function of time. The equation of motion can be re-written in the form:

$$I\frac{d^2\theta}{dt^2} + k\theta = m(t) + M(\theta) \quad (5)$$

where m(t) is actuating moment applied in order to sustain the mirror motion and $M(\theta)$ is the control moment. Since this control moment is a function of the angle only, it can be effectively viewed as a moment of a nonlinear spring which is loaded only at certain angles of tilting. This loading of the "spring" is completely similar to mechanical bouncing. The only difference that in the considered case this "spring" is realized using a feedback control mechanism. This scheme can be realized in the case that there is an ability to apply a high actuating moment during short "contact" time.

The very special properties of the bouncing mode actuator enable a set of applications in electrical and optical wave-shaping, where the actuator's payload forced movement (by an input signal) is transformed into a new shape (e.g. from sinusoidal to a triangular saw tooth) and frequency. Exemplary applications may include the movement of a micro-mirror so as to achieve a retinal scan-injection of a video display. The movement of the mirror facilitates a relatively simple electronic interface between standard video streams into the signaling that activates the display system. Another application may be in RF devices used, for example, for generation of various signals by a single element.

The following description uses electrostatic tilting as an exemplary actuation means. The electrostatically-tilted micro-mirror described herein fulfills the requirements of motion linearity, high operational frequency and low actuation voltages imposed by laser display applications. It is understood that the electrostatic actuation described may be replaced by other actuation methods such as thermal, magnetic, or piezoelectric actuations.

Figure 3:
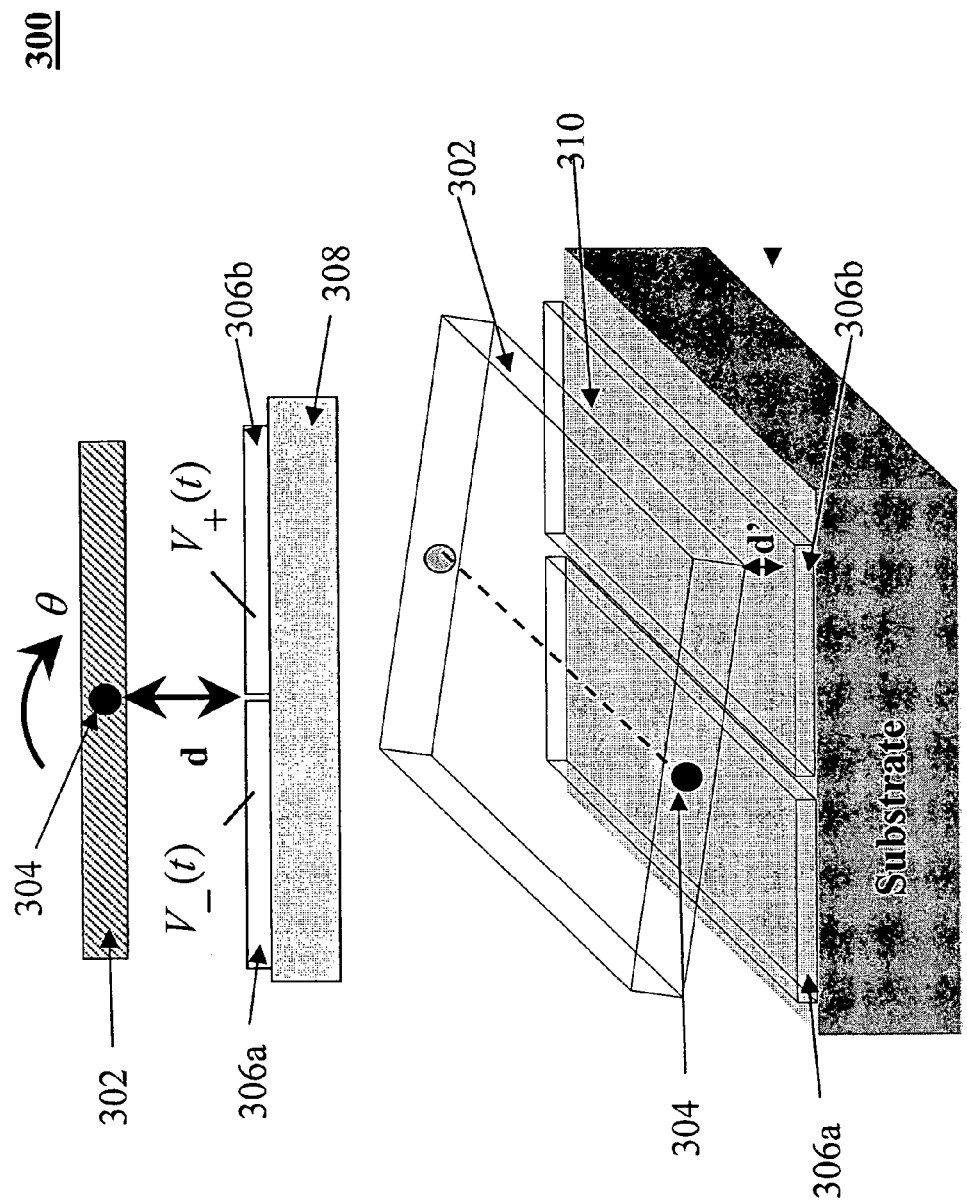
FIG. 3 illustrates schematically a prior art tilting mirror that uses parallel plate electrostatic actuators.

FIG. 3 shows schematically a prior art tilting mirror device 300 that uses parallel plate electrostatic actuators. Device 300 comprises a mirror 302 suspended by a torsion axis 304 at a distance d from two parallel plate electrodes 306a and 306b located under the mirror on a substrate 308. Due to the rotation of the mirror around axis 304, at a rotation angle close to the contact angle with the electrodes a distance d' between a mirror edge 310 and the electrode e.g. 306b is much smaller that the initial distance d. The incorporation of at least one pair of additional stiffness elements (bouncers) in the form of cantilevers, double edge clamped beams, etc. into this device is shown in FIG. 14.

Figure 20:
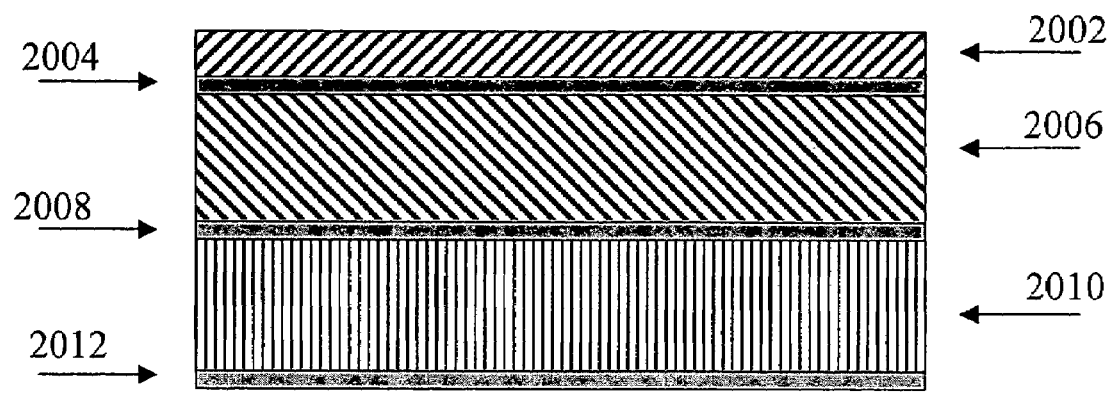
FIG. 20 shows in cross section various layers of a double-active-layer silicon-on-insulator (SOI) wafer.
Figure 21:
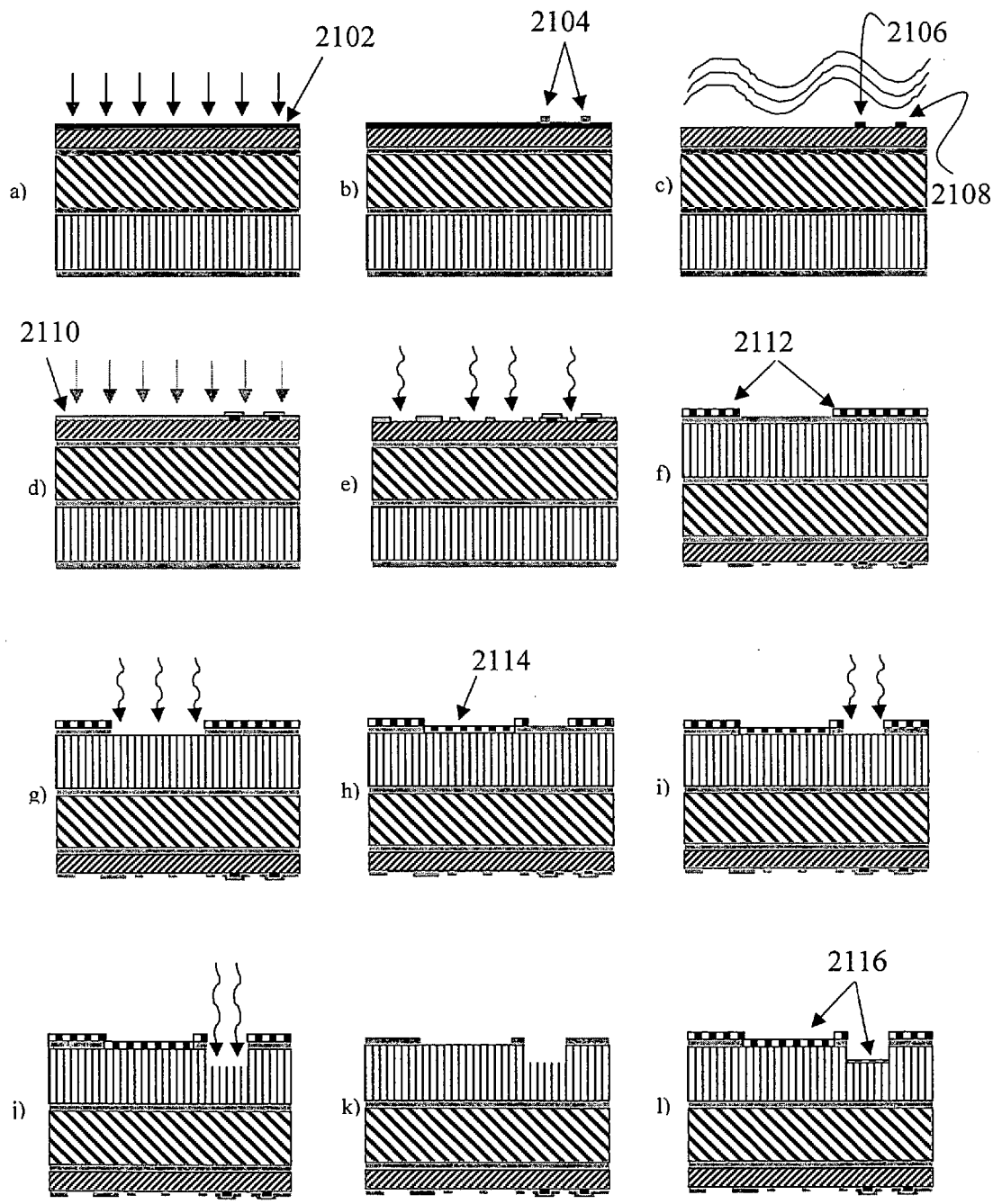
FIG. 21 shows an exemplary process for the fabrication of a bouncing mode micro-mirror using a double-active-layer SOI wafer.

FIGS. 4–13 describe the invention schematically in conceptual terms. FIGS. 14–19 and 22 describe the invention in specific MEMS geometries and designs, applicable for example to silicon or silicon on insulator (SOI) MEMS processes. FIGS. 20, 21 illustrate schematically the steps of a silicon MEMS process used to fabricate a preferred embodiment of the bouncing mode micro-mirror device of the present invention.

Figure 4:
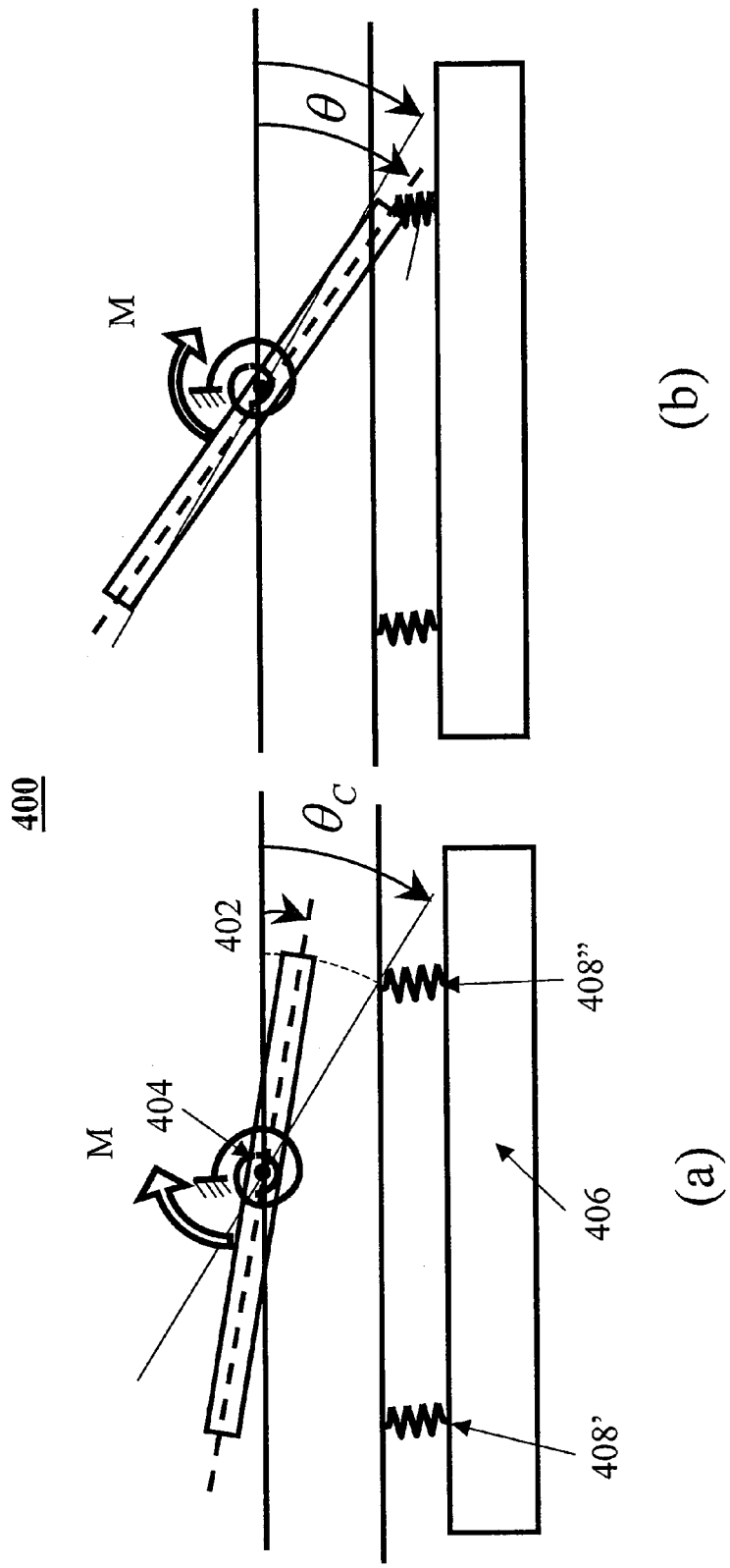
FIG. 4 shows a concept of a bouncing mode mirror and its operation principle according to the present invention.
Figure 5:
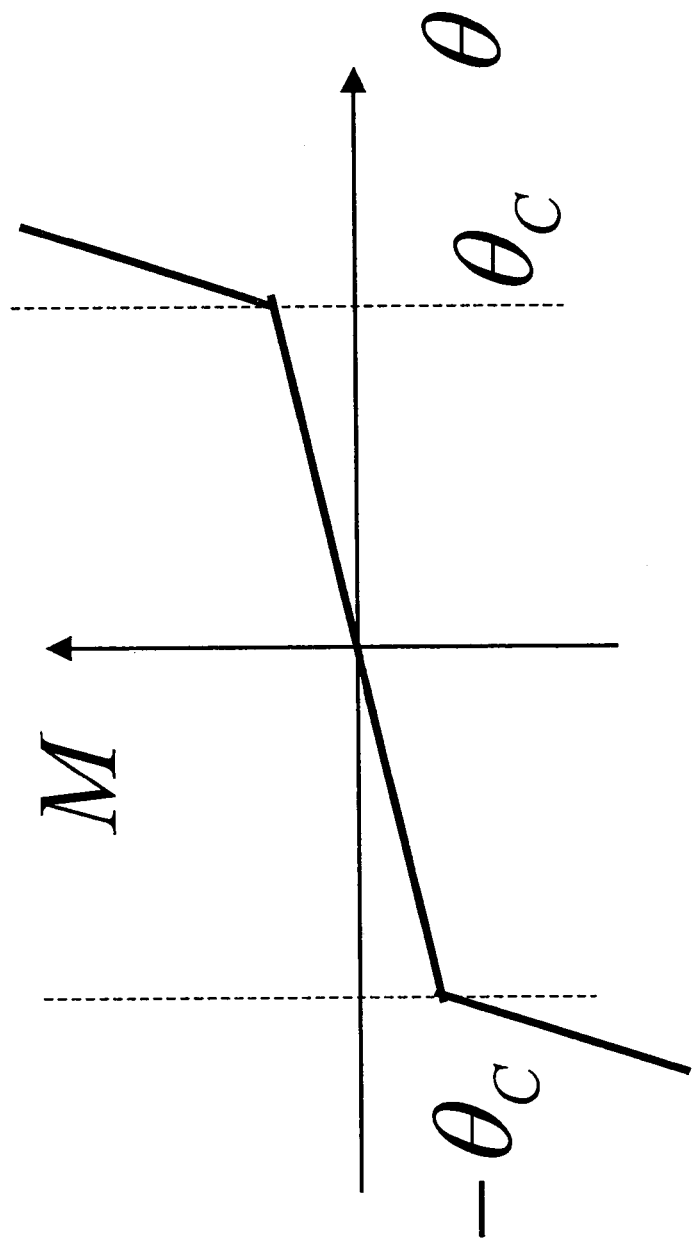
FIG. 5 shows schematically the dependence of the torsion stiffness (moment) on the tilting angle in the device of FIG. 4.

FIG. 4 shows schematically the concept of a bouncing mode micro-mirror device 400 and its operation principle according to the present invention. Device 400 comprises in (state a) a mirror 402 suspended on a torsion (tilt) axis 404 above a base plane 406. Under actuation, the mirror tilts (rotates) around axis 404 through a tilt angle $\theta$. Inventively and in contrast with prior art tilt mirrors, device 400 comprises at least one pair of nonlinear stiffness elements (e.g. elastic "bouncers" made of cantilevers, beams or strips or pre-curved nonlinear stiffness elements shown exemplarily in FIGS. 12 and 18) 408' and 408" that come into contact with the mirror when the tilt angle $\theta$ is larger that some prescribed contact angle value $\theta_c$. The following discussion of FIGS. 4–11 refers specifically to bouncers. Coming in pairs, the bouncers are preferably (although not necessarily) positioned symmetrically relative to (i.e. on both sides of) tilt axis 404. When contacted by the mirror (state b), elements 408' and 408" invert the mirror movement because of the increased torsion stiffness, as shown in FIG. 5. The nonlinear stiffness element (made of a particular material, e.g. silicon) may be designed and optimized such as to achieve a particular characteristic (bouncing effect) in response to an applied actuation force, using well known rules.

FIG. 5 shows schematically the dependence of the torsion stiffness (moment) M on tilt angle $\theta$ in the device of FIG. 4. The torsion stiffness is composed of the stiffness of torsion axis 404 and of the additional stiffness of a bouncer 408' or 408" on the tilting angle $\theta$. When the mirror contacts the bouncer, i.e. when $\theta > \theta_c$, the stiffness (defined by the slope of the M vs. $\theta$ curve) increases significantly. This provides a saturation-type, stiff nonlinearity necessary for the formation of the triangular signal.

Figure 6:
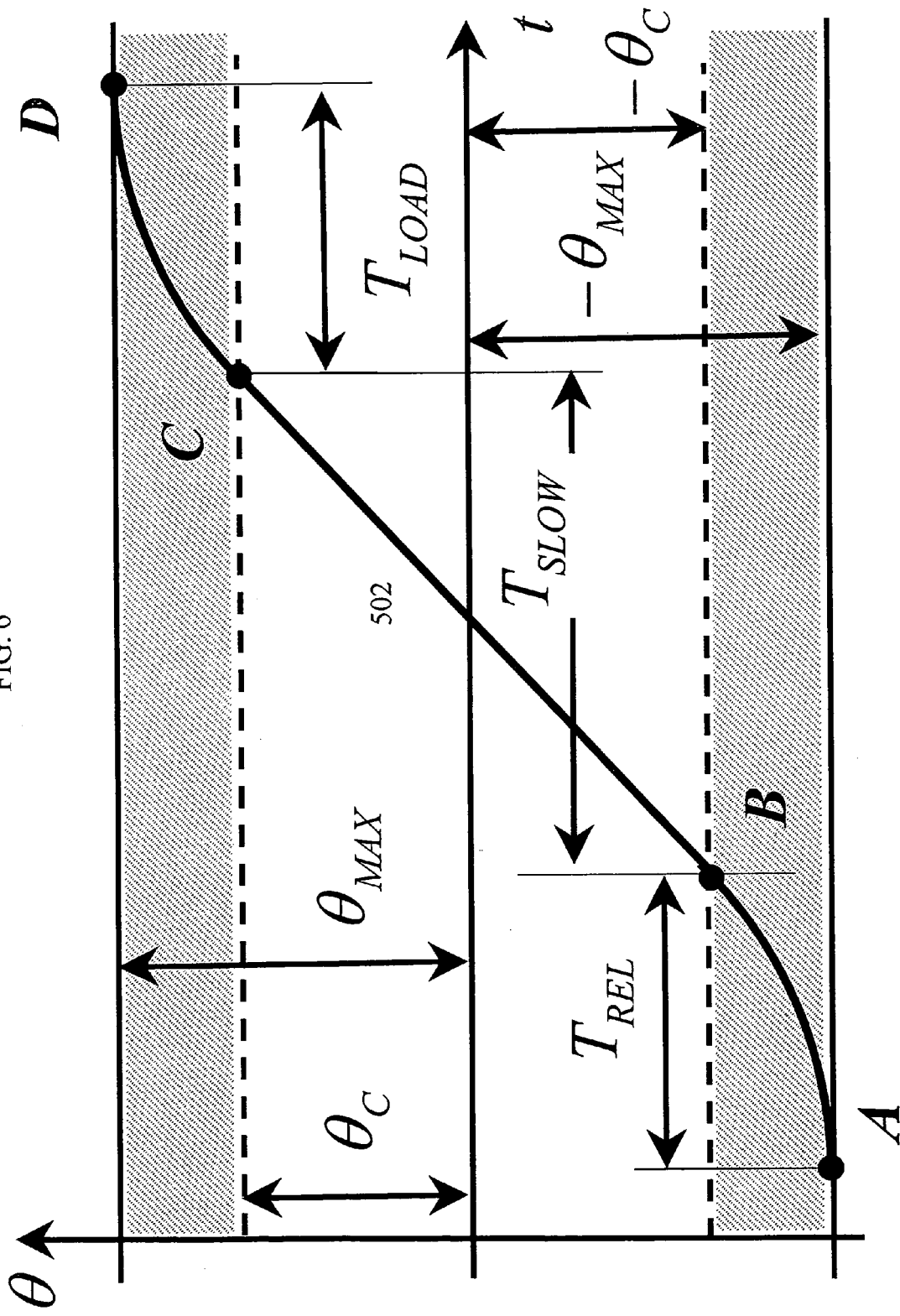
FIG. 6 illustrates schematically motion stages of a bouncing mode mirror as in FIG. 4.

FIG. 6 illustrates schematically motion stages (as expressed by a curve 602 showing a tilt angle $\theta$ vs. time t) of a bouncing mode mirror as in the device of FIG. 3. Curve 602 comprises 3 stages: a first fast stage between point A and B defined by a release time $T_{REL}$, a second slow stage between points B and C defined by a time $T_{SLOW}$ and a third fast load stage between points C and D defined by a time $T_{LOAD}$. During the slow stage (in which the mirror is not in contact with the bouncer), the mirror rotates with an almost constant angular velocity that is determined by the bouncer and the energy provided by the actuator. The strain energy stored in the deformed bouncer is transformed into the kinetic energy of the mirror. During the fast stages (i.e. when $\theta > \pm \theta_c$) the mirror is in contact with the bouncer and the kinetic energy of the mirror is transformed back into the strain energy of the bouncer. Since the stiffness of the bouncer is much larger that the stiffness of the torsion axis, the additional angle $\theta_{MAX} - \theta_c$ that corresponds to the deformation of the bouncer is much smaller that the total tilting angle of the mirror $\theta_{MAX}$.

In summary, the operational mode of the bouncing mode mirror, as illustrated in FIGS. 4–6 and as explained in more detail in the Krylov and Barnea reference above, incorporates a contact event between the mirror and an elastic constraint followed by a bouncing event and an inversion of motion. As shown in FIG. 5, the stiffness of the system is angle dependent.

Figure 7A:
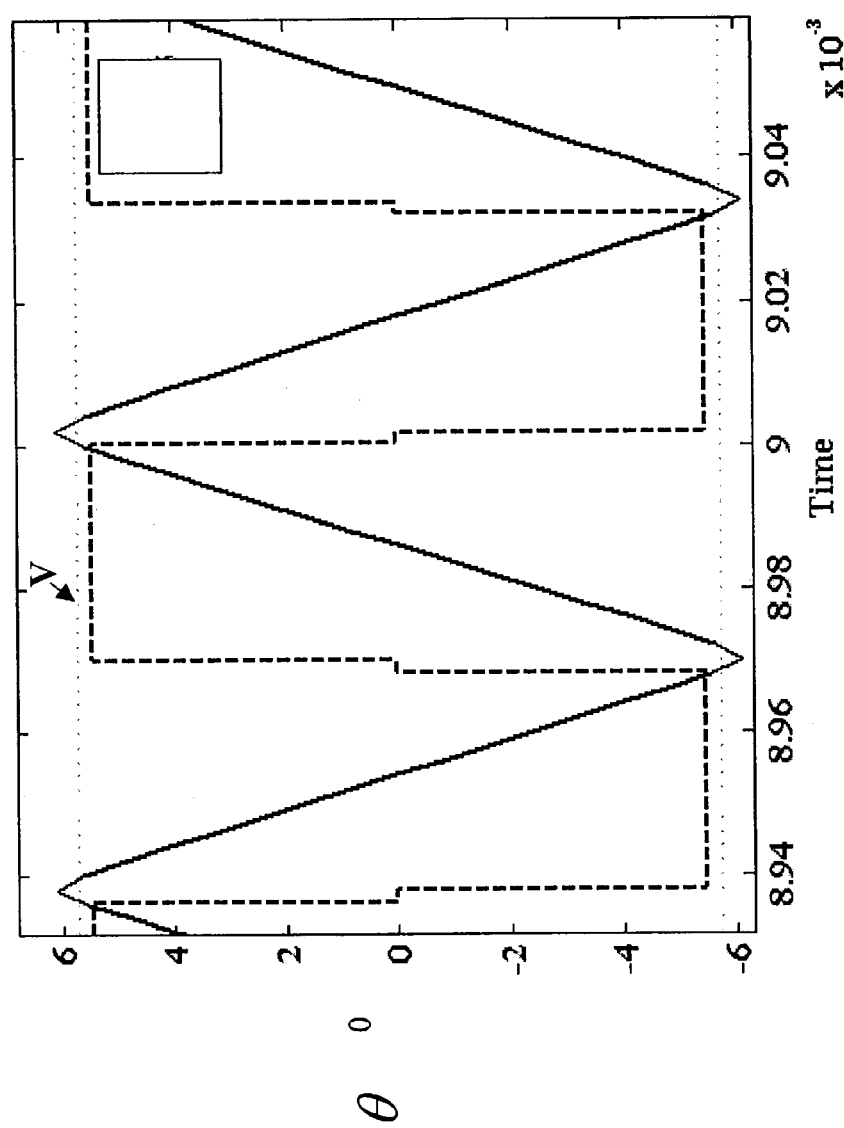
FIG. 7a illustrates the time history (angle-time dependence) of a bouncing mode mirror motion obtained by a simulation.
Figure 7B:
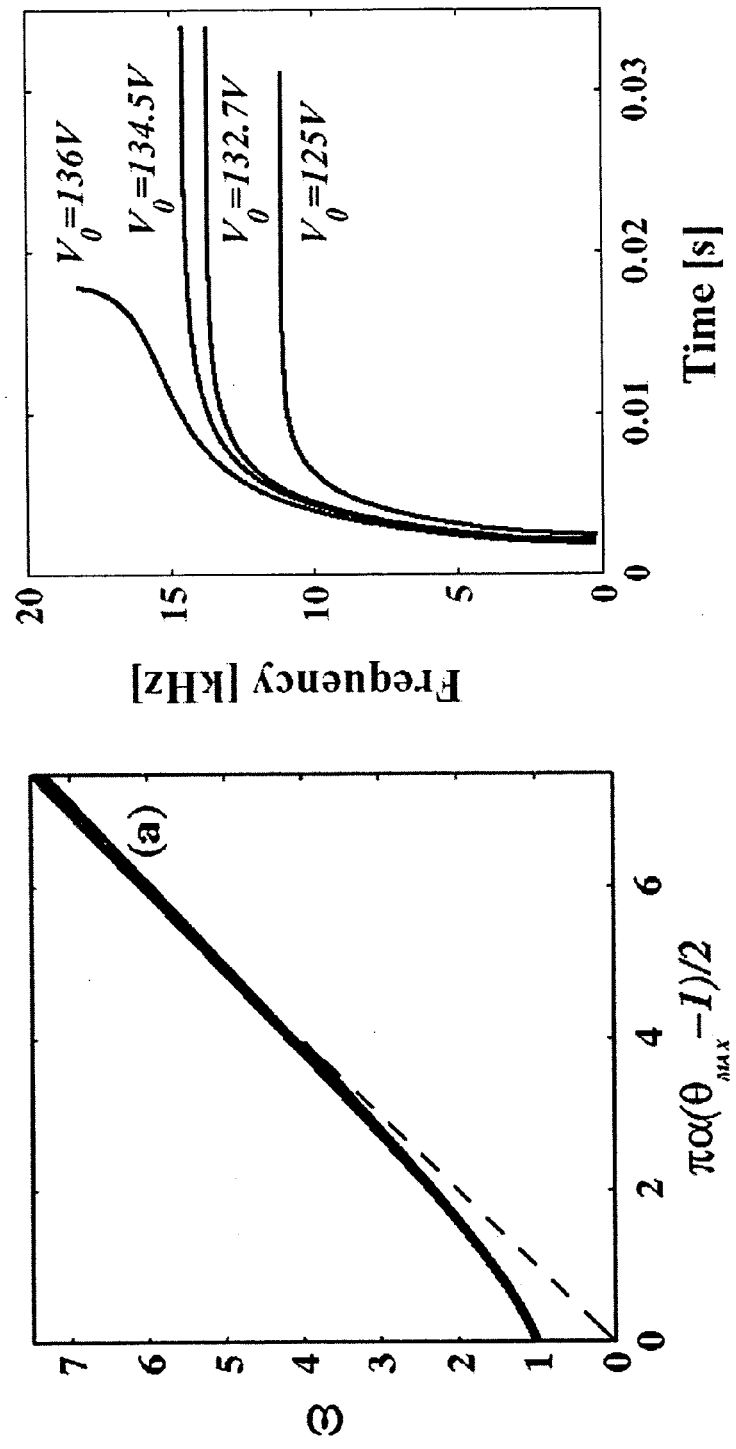
FIG. 7b illustrates the dependence of the natural frequency of the mirror on the deformation of the bouncer.

FIG. 7a illustrates the time history (tilt angle $\theta$ vs. time t dependence) of a bouncing mode mirror motion obtained by a simulation. Details may be found in the Krylov and Barnea reference. The simulation uses a piecewise constant-in-time voltage actuation signal marked by (dotted line) V and applied to the electrodes, and the result (full line) is a triangular angle-time dependence. The angular velocity is practically constant. FIG. 7b illustrates on the left the dependence of the natural frequency of the mirror $\omega$ on the deformation of the bouncer. Starting from some value, the frequency is a linear function of the bouncer deformation. This property is very useful for the control of the mirror frequency and permits the tuning of the mirror natural frequency in a very large range. As shown by the "Response frequency vs. voltage" graph in the right box in FIG. 7b, the response resonant frequency may be tuned by voltage control. The tuning of the resonant frequency through the control of the applied voltage permits the synchronization of the response of a micro-fabricated device with a video signal.

The "quality" of the response shown in FIG. 7a, namely the linearity of the rotation angle in time, is defined by the ratio $M_B/M_{TA}$ between the stiffness of the elastic bouncer $M_B$ and of the torsion axis of the mirror $M_{TA}$. An increase in this ratio can be achieved by the hardening of the bouncer or alternatively by the softening of the torsion axis. The natural frequency of the mirror is defined mainly by the deformation of the elastic bouncer and consequently by the actuation voltage, and is practically independent of the stiffness of the torsion axis $M_{TA}$. This suggests that $M_{TA}$ has to be reduced to a minimum. This reduction can be achieved by the design means and is limited only by the requirements of the minimal out-of-plane stiffness of the axis.

Figure 8:
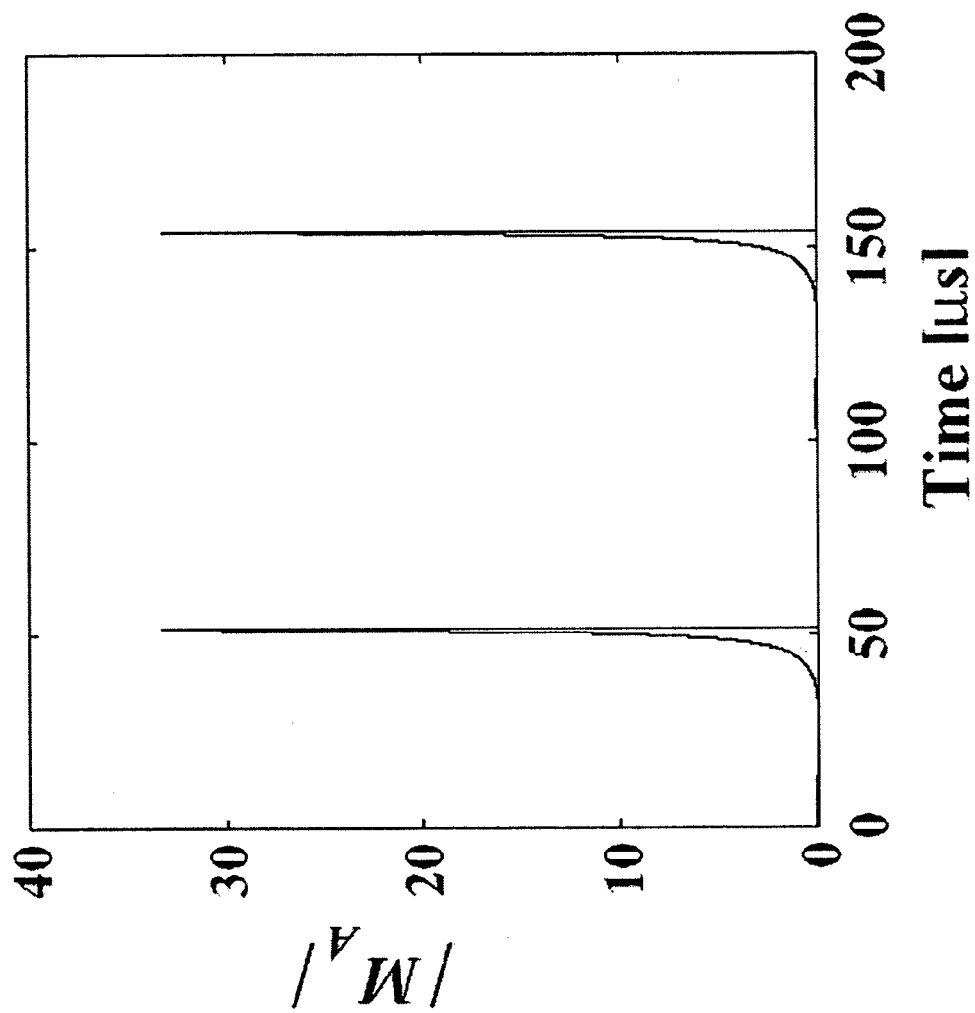
FIG. 8 illustrates the simulated time history of an actuation moment $M_A$ resulting from a bouncing event.

FIG. 8 illustrates the time history of the resulting actuation moment $M_A$ The proximity of the mirror edge to the electrodes results in the increase in the actuation moment. Attractive electrostatic forces large enough are used to deform the bouncer and invert the velocity. The elastic energy stored in the bouncer is transformed into a repelling force acting on the mirror. The combination of additional stiffness element and parallel plate electrodes working in a proximity mode permit the achievement of very large repelling forces in the electrostatic actuator.

Figure 9:
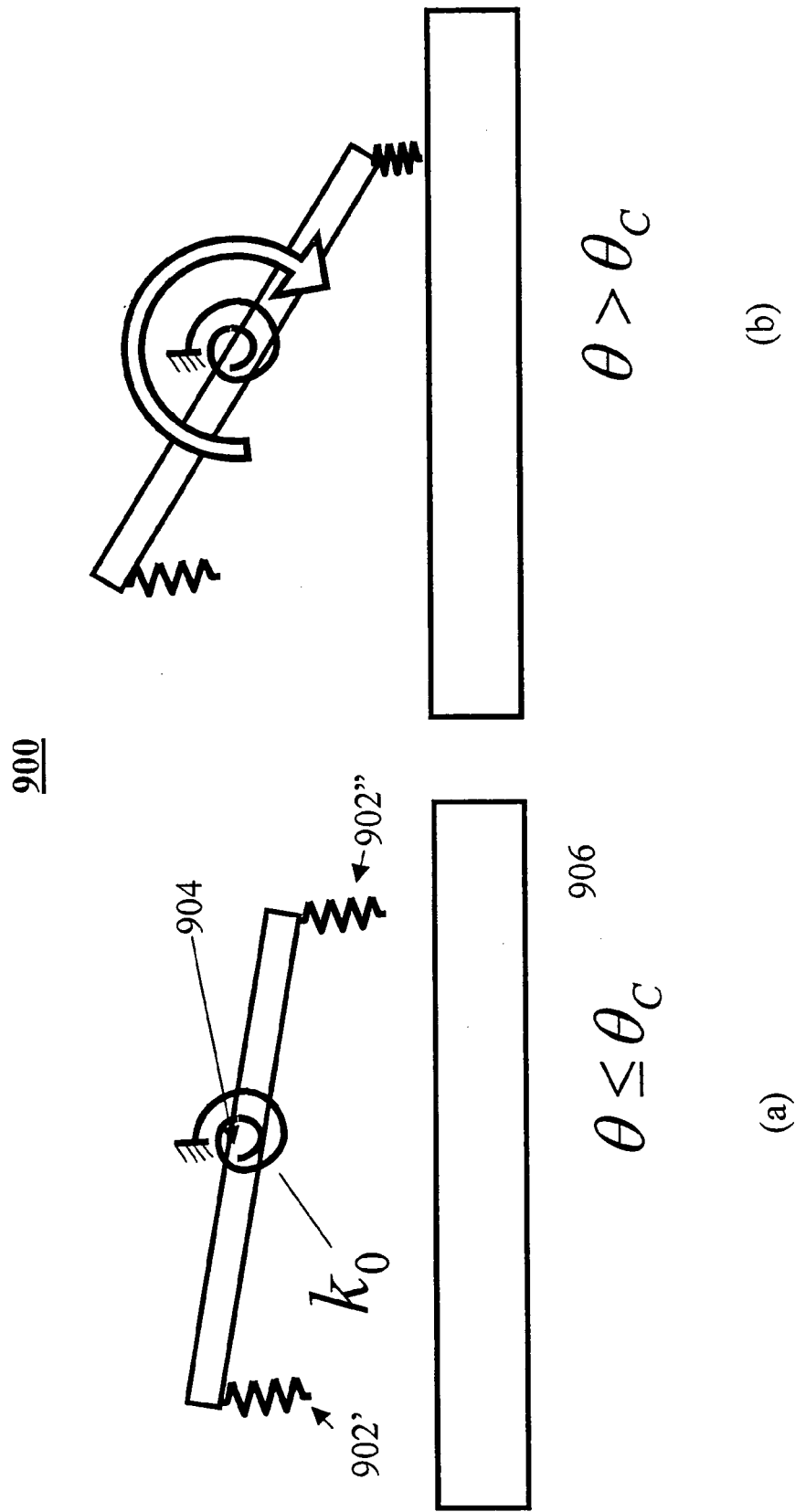
FIG. 9 shows schematically yet another embodiment of a bouncing mode micro-mirror device in which the bouncers are connected to the mirror.

FIG. 9 shows schematically yet another embodiment of a bouncing mode micro-mirror device 900 according to the present invention. In FIG. 9, least one pair of bouncers 902' and 902" is attached to a mirror 904 instead of to a substrate 906. Bouncers 902 are now mobile, in contrast to bouncers 408 (FIG. 4), which are attached to the substrate and immobile. The advantage of this configuration is a simpler fabrication process, since bouncers 902 can be fabricated in the same layer as the mirror (e.g. an active Si layer in a SOI substrate). As in FIG. 4, (a) shows the mirror before it touches the substrate through the bouncer, and (b) shows the mirror in contact with the substrate through the bouncer.

FIG. 10 shows in (a) schematically yet another embodiment of a bouncing mode micro-mirror device 1000. The configuration is similar to that of FIG. 4, except that the device comprises at least one additional pair of "softer" (relative to the first pair) bouncers 1002' and 1002". More pairs of bouncers with varying softness are of course included in the definition of "at least one additional pair". Bouncers 1002' and 1002" are operative to manage the contact velocity in order to improve reliability and soften the impact. A stiffness-angle dependence plot similar to that in FIG. 4 is shown in (b) for this configuration. One can see two added sections 1004 and 1006 with slopes intermediate to the slope of the "slow" section and that of the two "fast" sections. These sections show that the impact velocity is lower.

Figure 11:
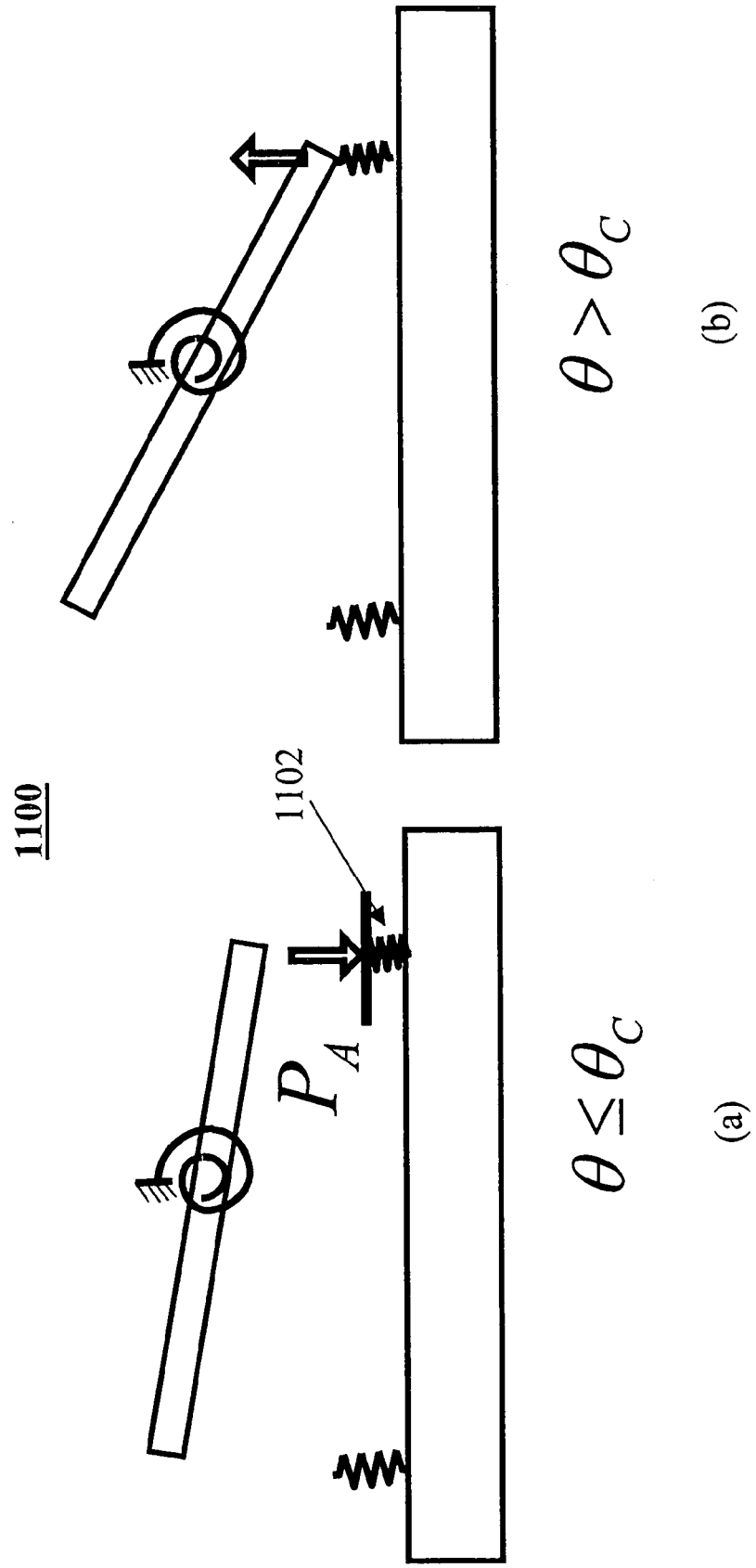
FIG. 11 shows schematically yet another embodiment of a bouncing mode micro-mirror device that comprises an active, independently deformable bouncer.

FIG. 11 shows schematically yet another embodiment of a bouncing mode micro-mirror device 1100 that comprises at least two active, independently deformable bouncers 1102. An active bouncer 1102 is deformed not by the mirror but by an additional force $P_A$, which is applied directly to the bouncer (stage a, when $\theta<\theta_c$), independently of the mirror motion. This permits to store a larger energy in the bouncer in order to provide non-symmetric saw tooth signals and to reduce the impact velocity to zero, since the kinetic energy of the mirror is not required anymore for the bouncing deformation. In stage b when $\theta>\theta_c$, the bouncer previously deformed by the force returns its energy to the mirror.

Figure 12B:
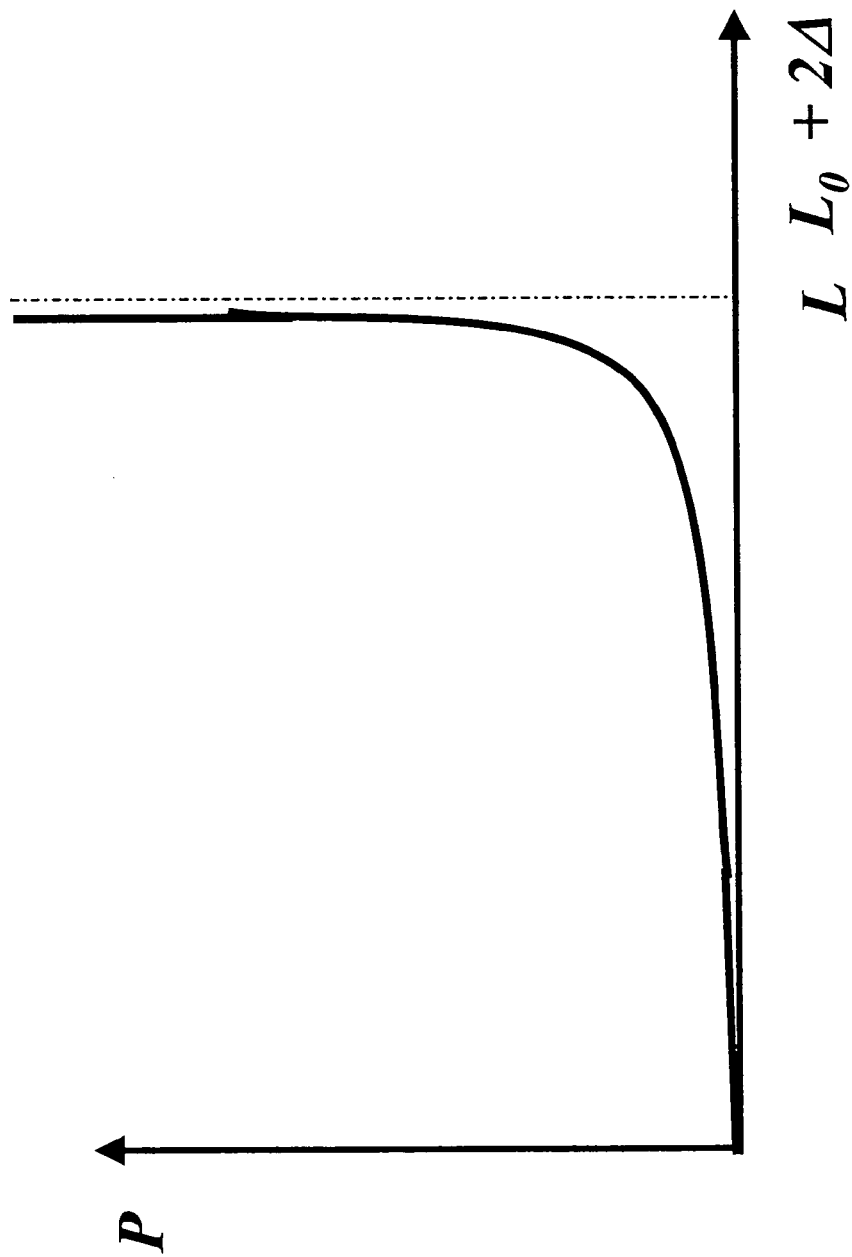
Figure 13A:
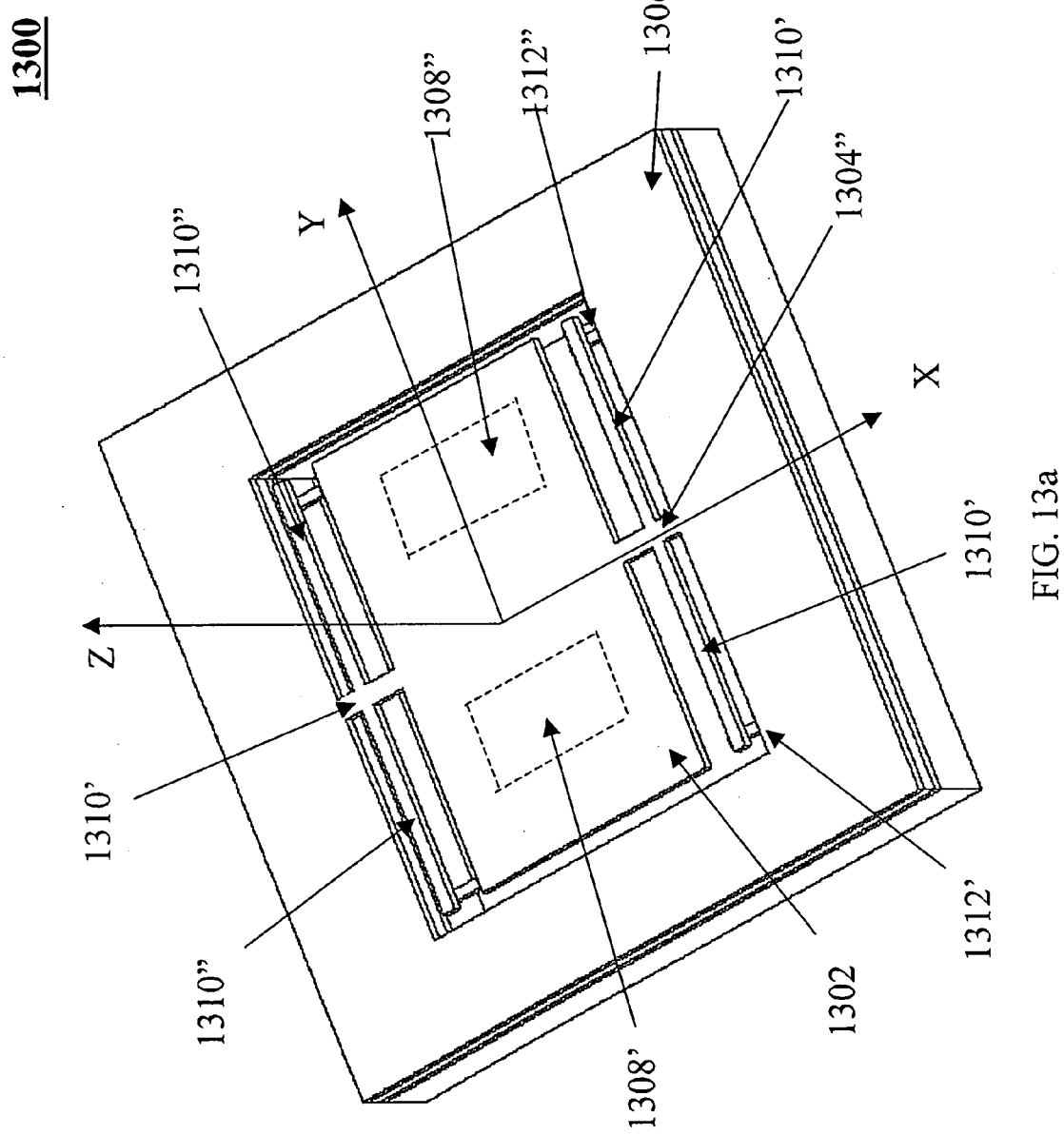
FIG. 13 shows an embodiment of a parallel plate actuated bouncing mode mirror with bouncers: a) isomeric view; b) top view; c) side view without actuation; d) side view with actuation.
Figure 13B:
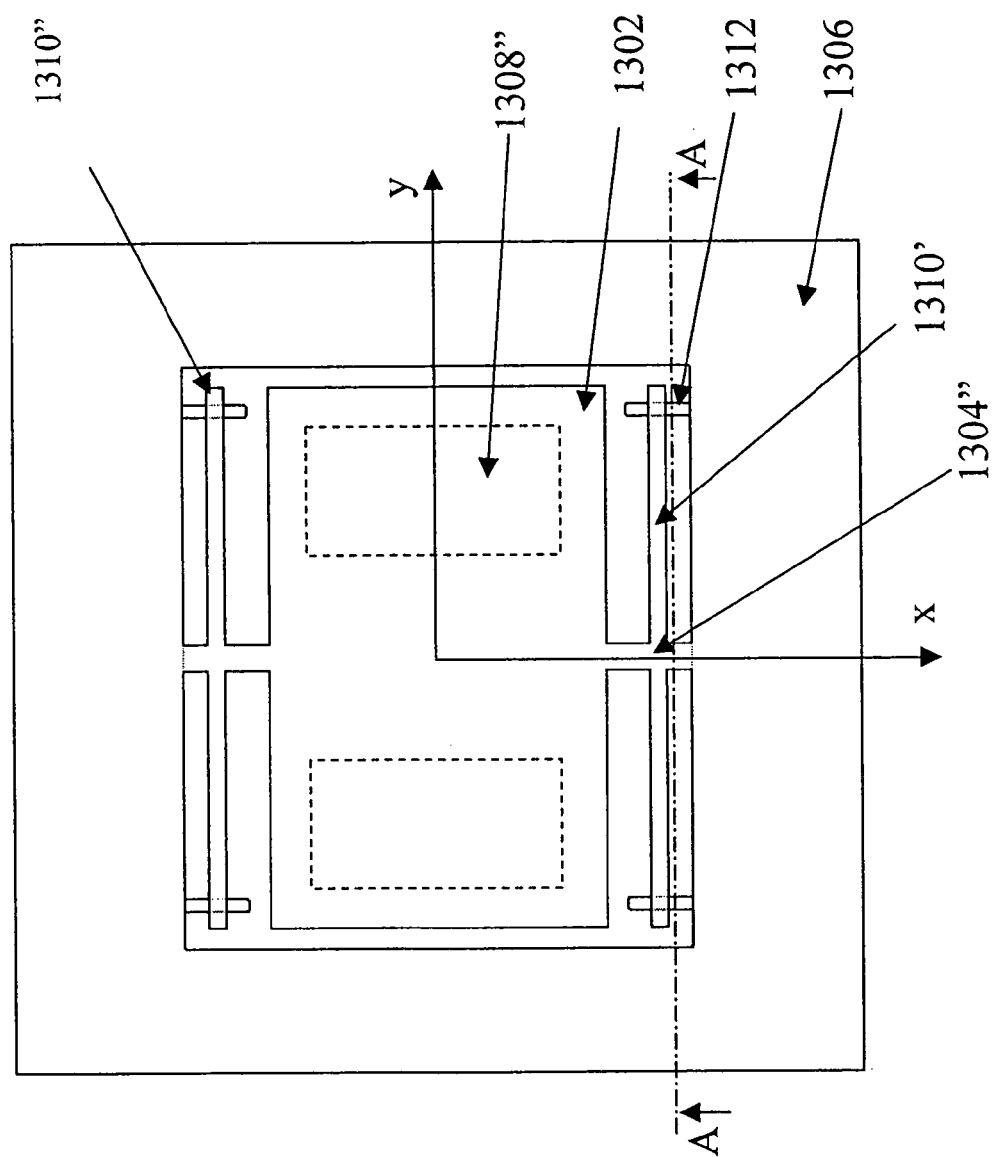
Figure 13C:
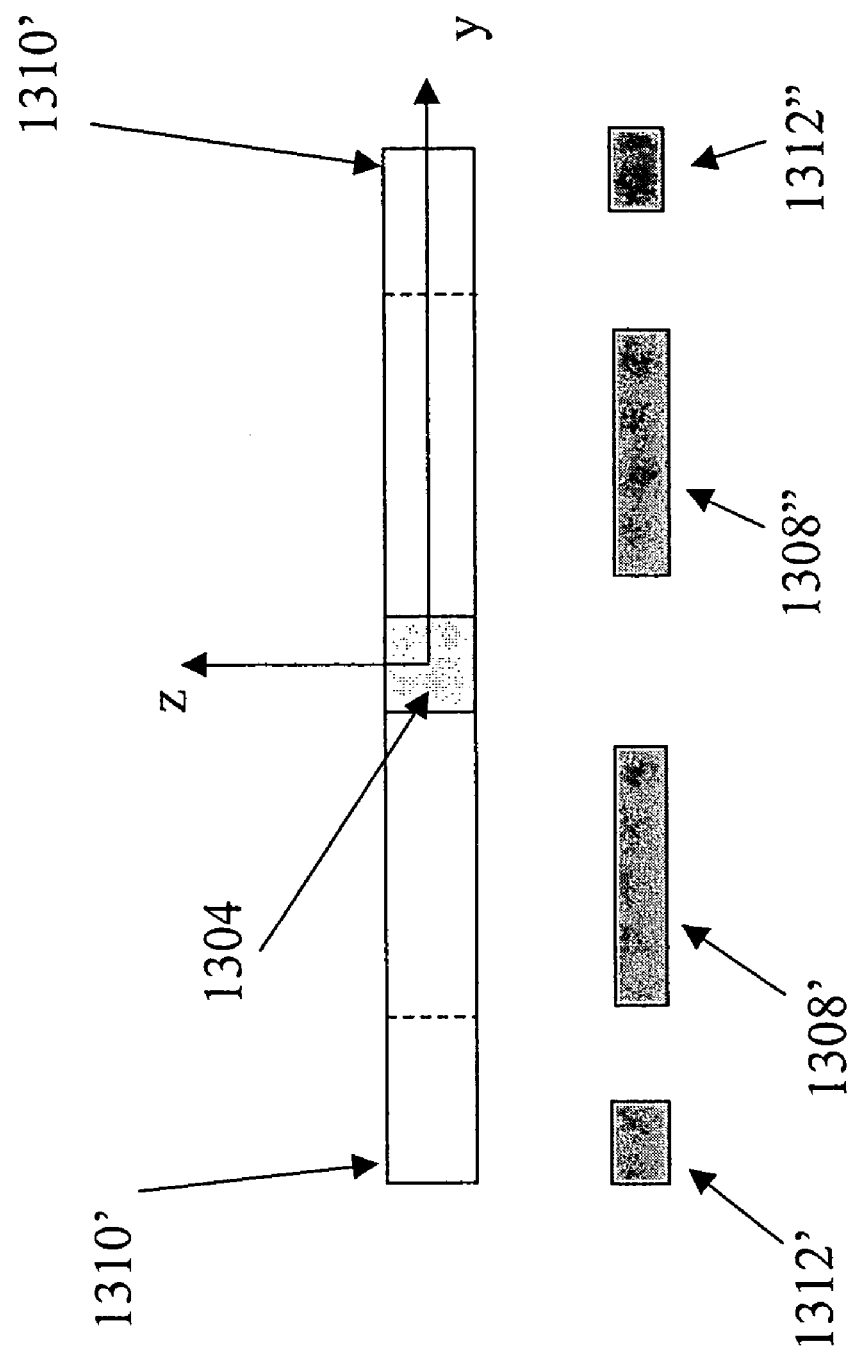
Figure 13D:
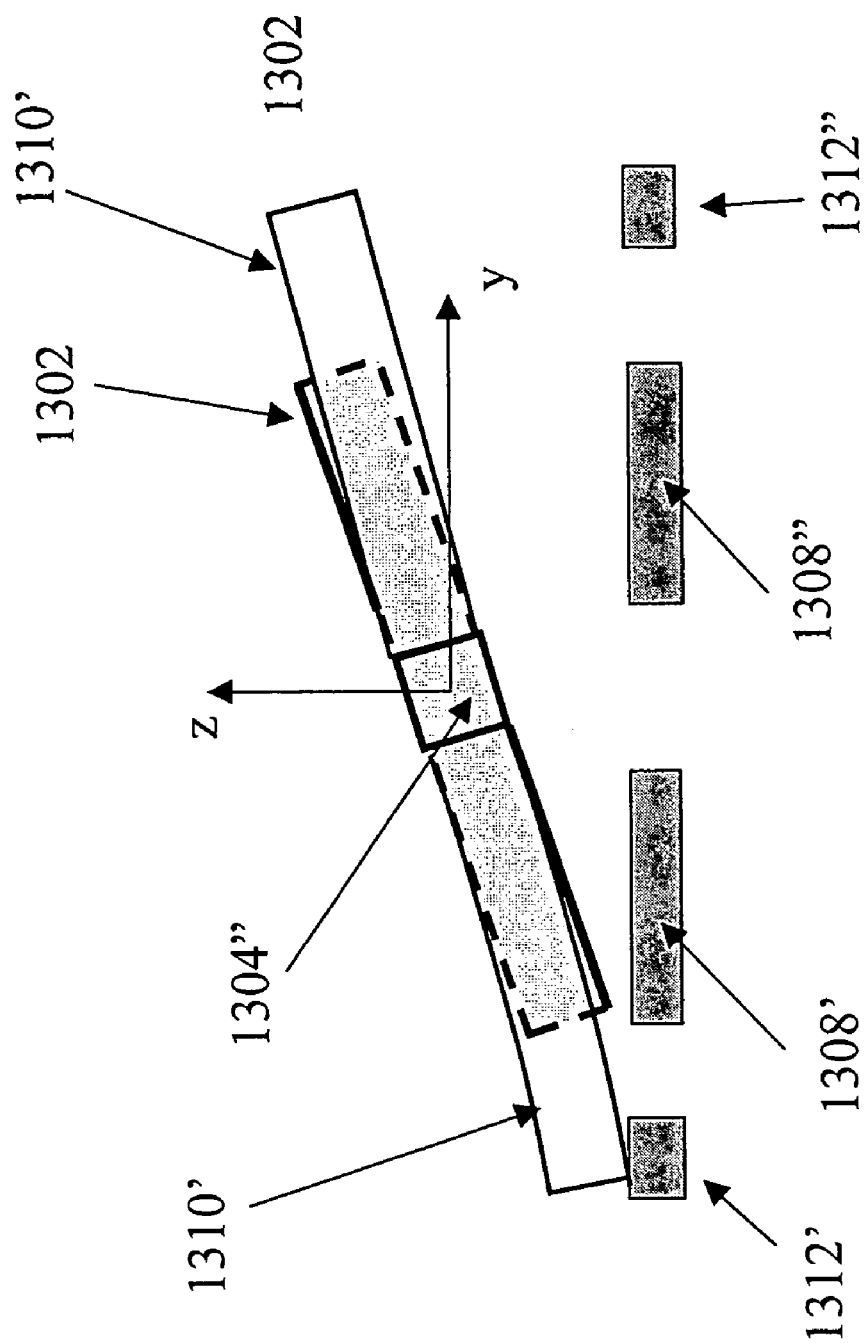

FIG. 12 shows schematically a conceptual pre-curved nonlinear stiffness element (e.g. a beam, a string, etc.) 1200 with two ends 1102 and 1104 that may be advantageously used in the bouncing micro-mirror devices of the present invention. A "pre-curved" element in the present invention is an element with at least one section having a radius of curvature that is not infinite. Element 1200 is pre-curved in such a way that in an original (non-stressed) pre-curved state, the distance between its two ends is $L_0$. A force P with a starting value of P1 is applied to ends 1102 and 1104. Length $L_0$ increases by an elongation $\Delta L$ when the force reaches a value P2. FIG. 12b illustrates the dependence between the applied force P and the elongation L of element 1200. The dependence of the elongation on the force is highly nonlinear and is a function of the initial shape of element 1200. In order to straighten the element completely, a theoretically infinite force needs to be applied. Due to its high nonlinearity, the element characteristics are close to those of an ideal bouncer. The dimensions of a pre-curved element of the present invention may be designed and optimized to achieve a particular characteristic (bouncing effect) in response to an applied force. Implementations of element 1200 as a nonlinear stiffness element are shown in the systems in FIGS. 15–17.

FIG. 13 shows in (a) isomeric view and (b) top view an embodiment of a parallel plate actuated bouncing mode mirror device 1300 that includes bouncers (bouncers) of the present invention connected to a mirror. This embodiment implements the concept shown in FIG. 9. Device 1300 comprises a mirror 1302 situated in an XY plane and connected by two torsion bars 1304' and 1304" to a substrate 1306. Mirror 1302 is rendered electrically conductive (e.g. by a deposited metallization) so that it can be pulled into the −Z direction by one of two electrodes 1308' and 1308" located in a lower XY plane (below and separate from the mirror plane). Device 1300 further comprises at least one pair of spring beams 1310' and 1310" that are fixedly connected to (and in fact preferably part of the same layer as) torsion bars 1304. Beams 1310' and 1310" serve as impact nonlinear stiffness springs. Device 1300 further comprises at least one pair of stoppers 1312' and 1312" that stop the movement of the mirror when the mirror rotates around torsion bars 1304, by contacting spring beams 1310. In essence, the bouncers in this embodiment are beams connected at one end to the mirror (or to the torsion bar of the mirror), the other end being free. The beam bends upon contact with a stopper, building up energy that eventually reverses the mirror rotation, bouncing it back. The location of the bouncers (when connected to the torsion bar) may be optimized to give the mirror a high rotation angle. Enlargements of the area of contact between beams 1310 and stoppers 1312 are shown in FIGS. 13(c) and (d). FIG. 13(c) shows a spring beam that is not in contact with a stopper. FIG. 13(d) shows a spring beam during contact with stopper 1312'. The bending of the beam during contact is shown in a highly exaggerated way, for illustration purposes only.

Figure 14A:
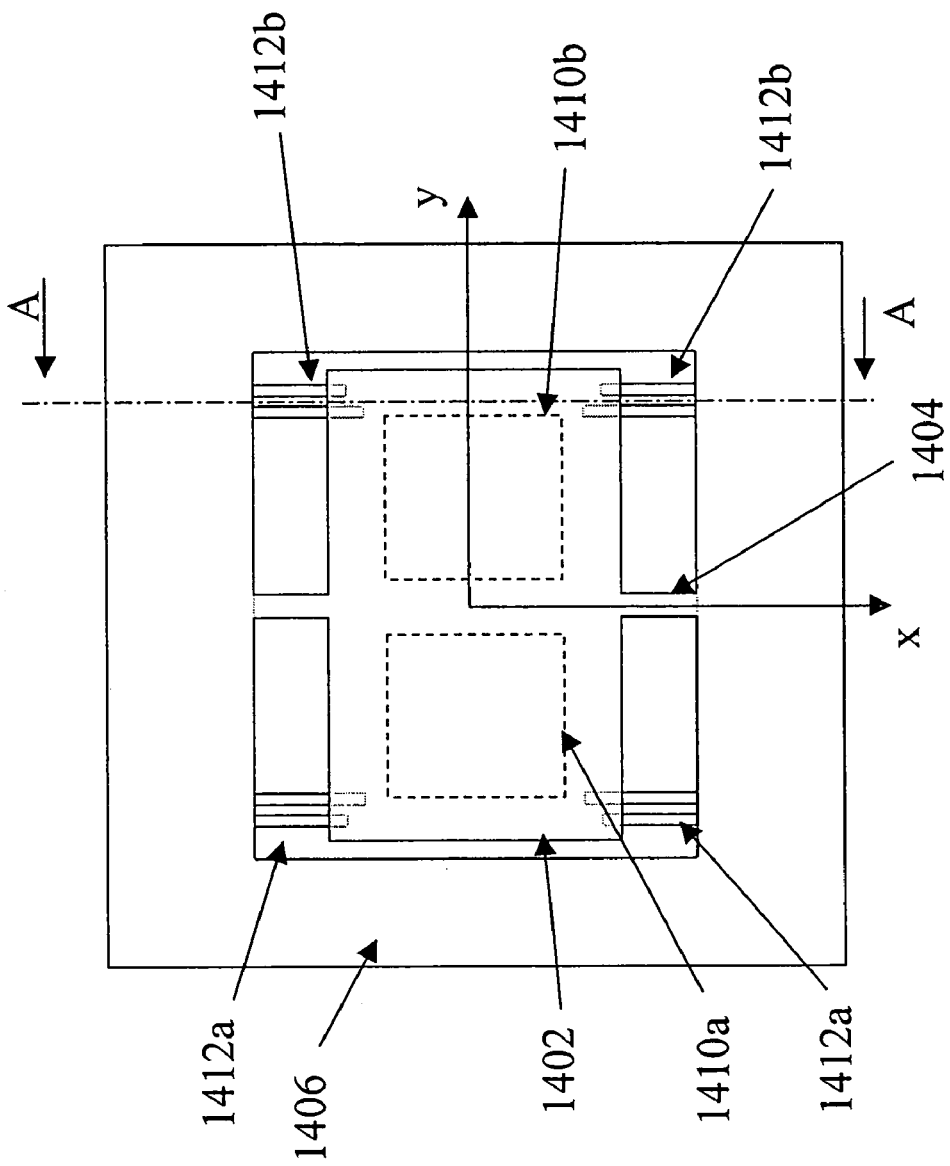
FIG. 14 shows in (a) top view, and (b) and (c) isomeric views an embodiment of a mirror device with a bouncers driven by parallel plate electrostatic actuators.
Figure 14B:
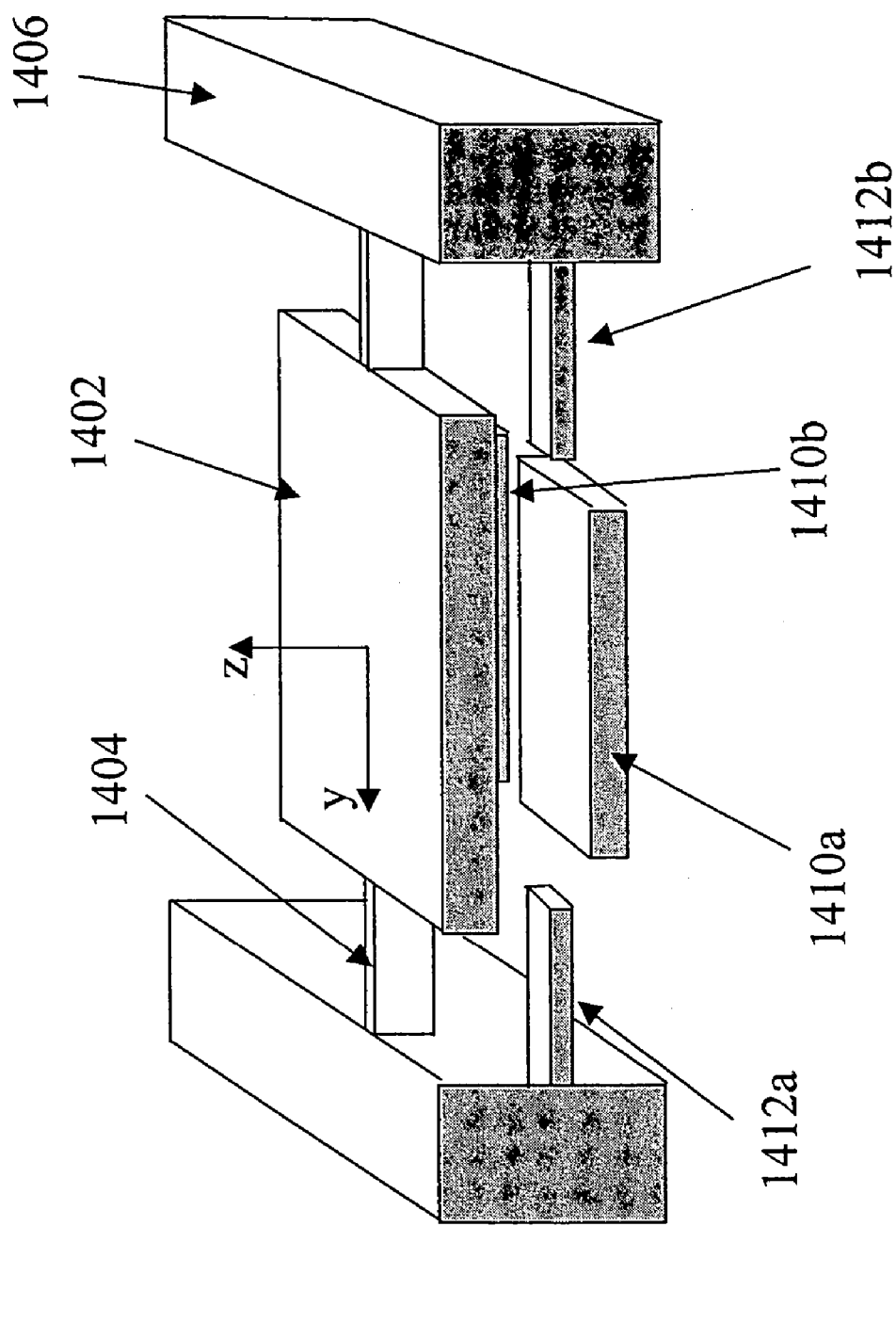
Figure 14C:
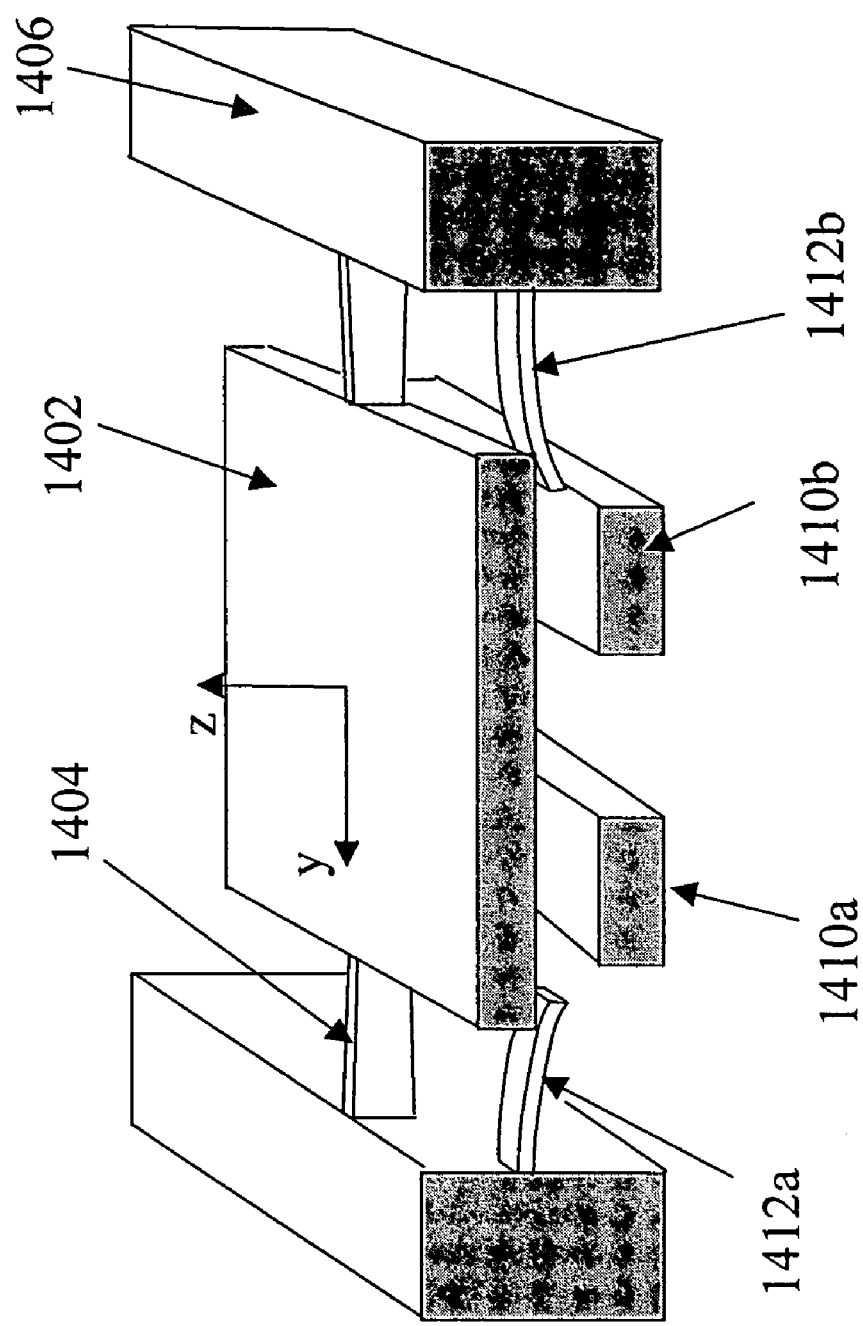
Figure 15A:
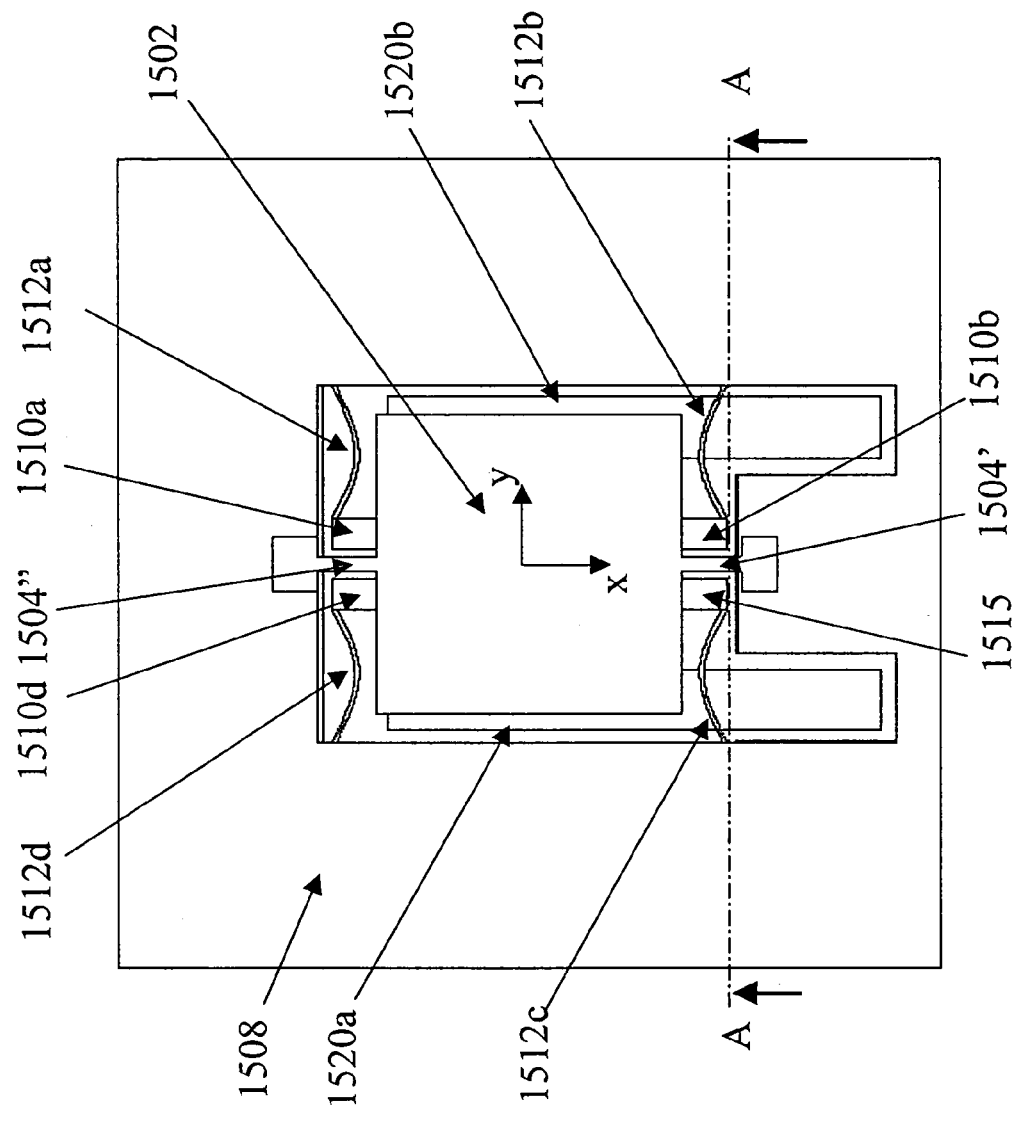
FIG. 15 shows: (a) top view and, (b) isomeric view an embodiment of a rotational parallel plate actuated bouncing mode mirror device with pre-curved nonlinear stiffness drive elements; (c) isomeric view emphasizing a side with section A—A; (d) section A—A before deformation; (e) section A—A after deformation by electrostatic forces.
Figure 15B:
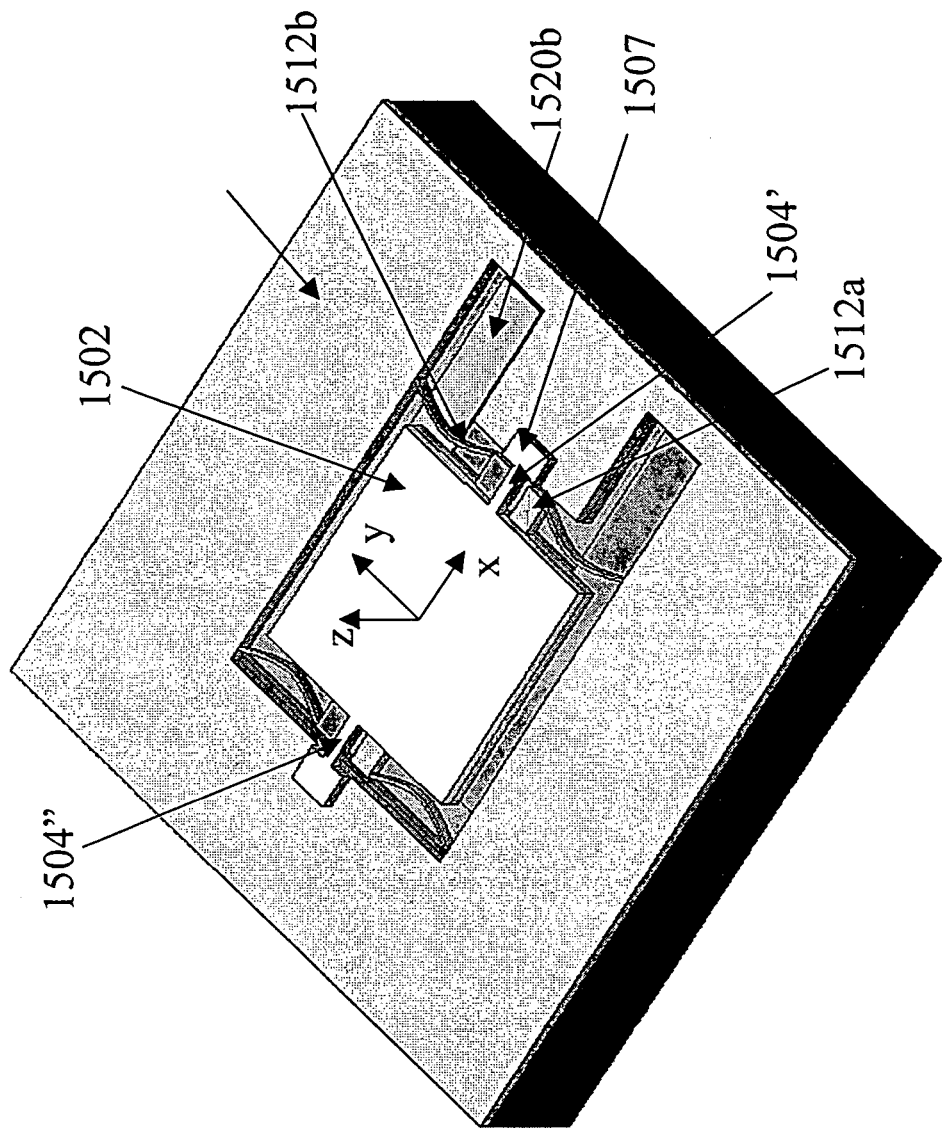
Figure 15C:
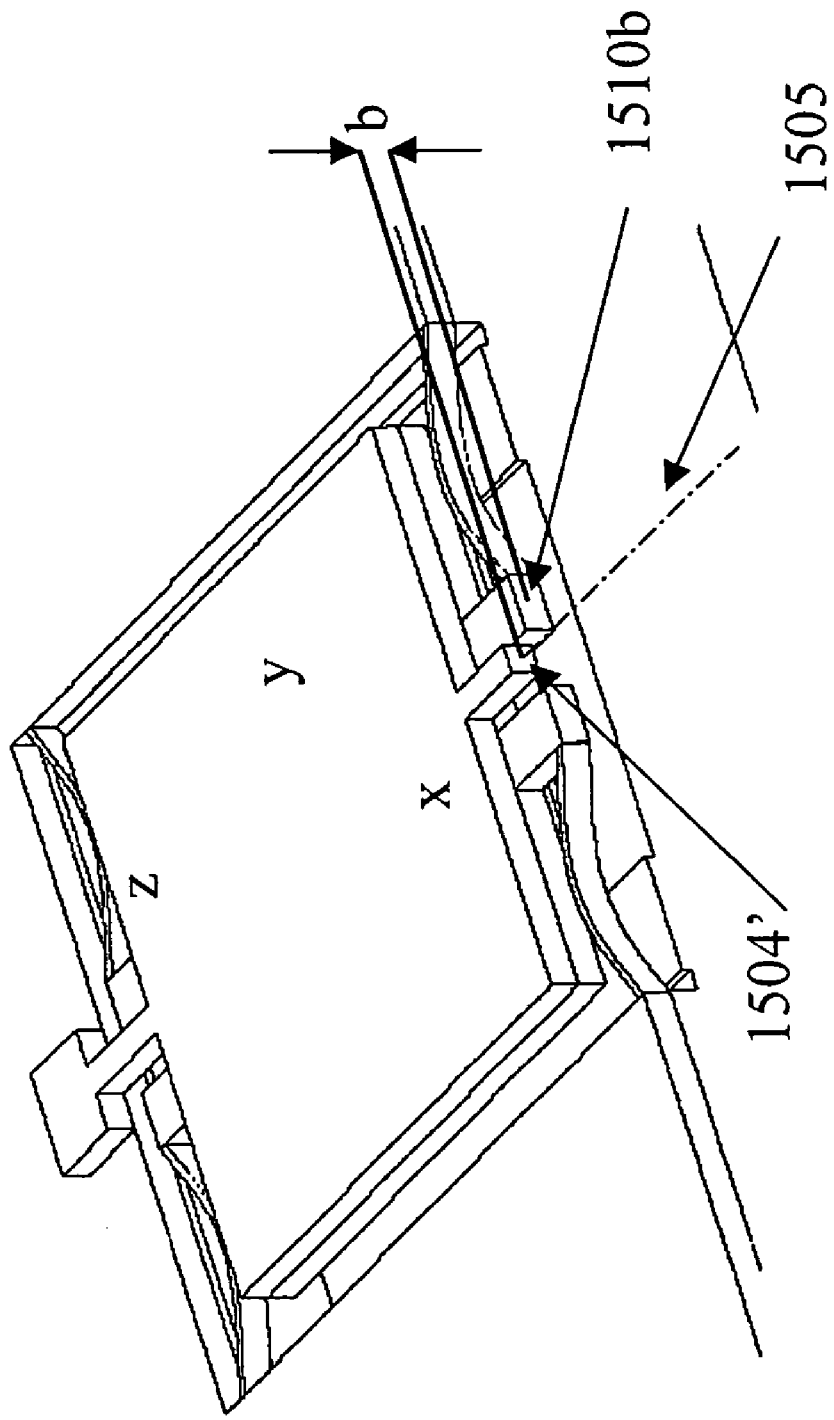
Figure 15D:
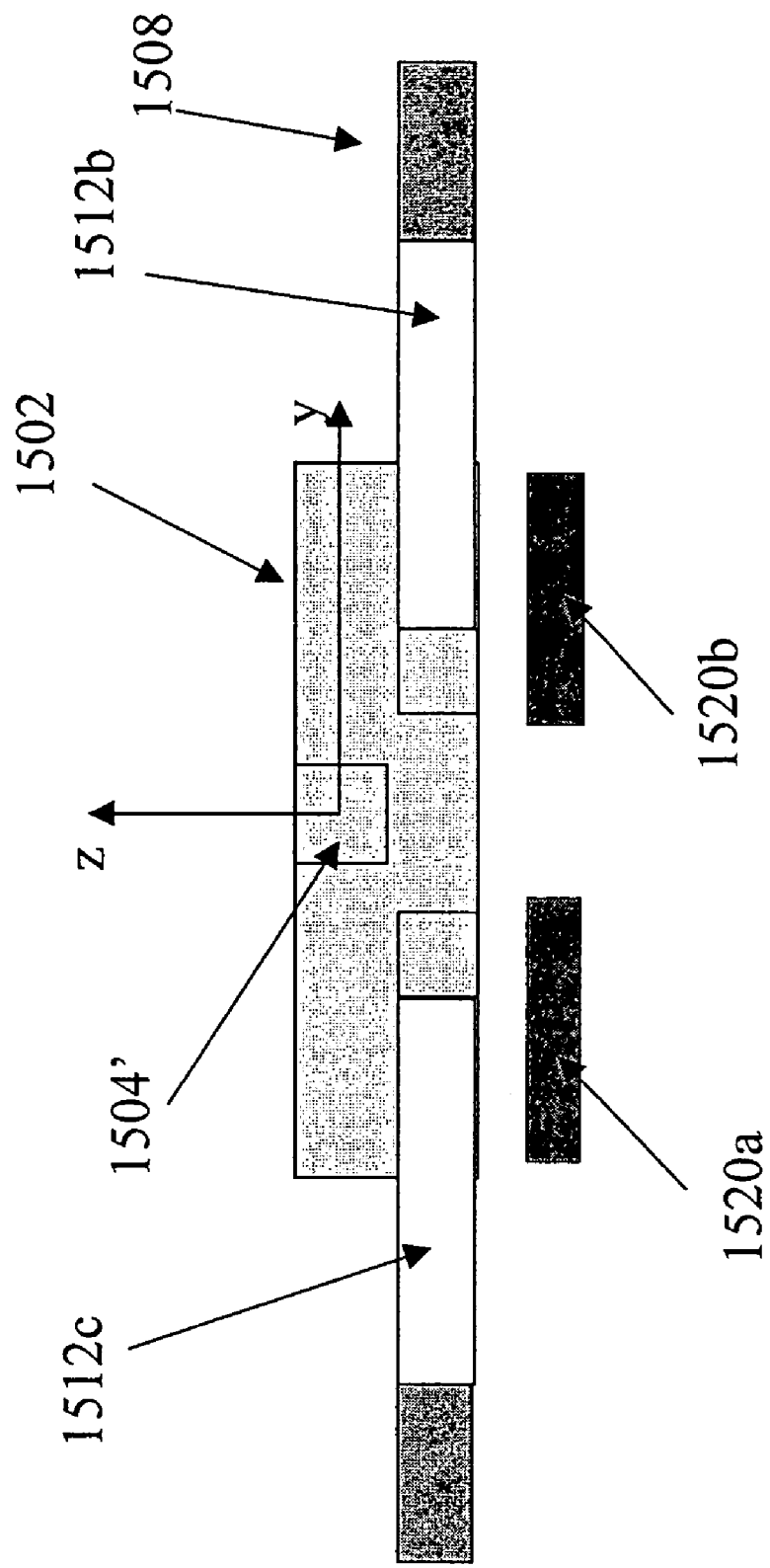
Figure 15E:
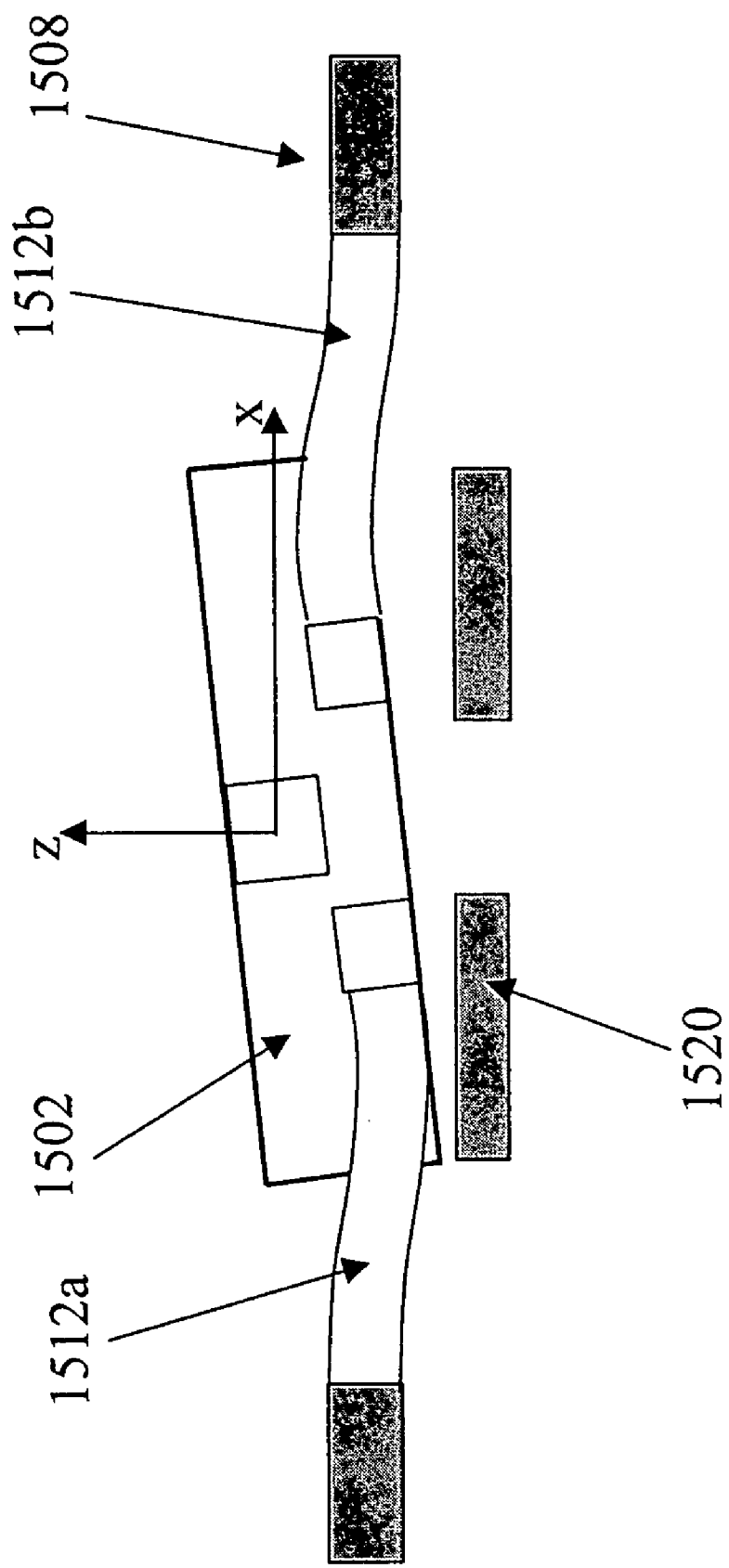

FIG. 14 shows an embodiment of a mirror device 1400 with at least one pair of bouncers (spring beams) 1412 connected to a substrate 1406 and driven by parallel plate electrostatic actuators: (a) top view, (b) and (c) isomeric views taken along a section A—A of FIG. 14(a). This embodiment implements the concept shown in FIGS. 4 or 10. Only one pair of spring beams is shown in (b) and (c), although it is understood that two or more springs with different stiffness characteristics may be attached (in pairs) to the substrate on each side, as shown exemplarily in FIG. 14(a). Device 1400 comprises a mirror 1402 in plane x-y connected by at least one pair of torsion beams 1404 to a substrate 1406, and pulled in −z (into the page) direction by one of two electrodes 1410a, 1410b located in a lower x-y plane layer. The mirror rotates until it contacts with its edge at least one spring beam 1412 that is clamped to substrate 1406 at the electrode level (plane). When more than one beam is used, each beam may have different elastic properties, for example the same cross section but different length, as shown in FIG. 14(a). The mirror deflects the springs and bounces back. In other words, in this embodiment the bending beam is fixedly attached at one end to the substrate instead of to the mirror. The deflection of the springs is shown in a highly exaggerated way in (c).

FIG. 15 shows in (a) top view and in (b) isomeric view an embodiment of a rotational parallel plate actuated bouncing mode mirror device 1500 with pre-curved nonlinear stiffness elements. This embodiment makes use of pre-curved C-shape elements of the type shown in FIG. 12 and FIG. 18a. Device 1500 comprises a mirror 1502, in this case rectangular but in general of any regular symmetric shape (for example round). Mirror 1502 is situated in an XY plane and connected by two torsion bars 1504' and 1504" aligned along a common torsion axis 1505 and ending each in elevations (or "pads") 1507 on top of a substrate 1508. Device 1500 further comprises two pairs of short "offset" beams 1510a and 1510d, and 1510b and 1510c, which are located in a lower part of the mirror, at an offset b from the top surface, see section A—A view in FIG. 15(c). The offset beams are respectively connected by at least one pair (in this case two pairs) of preferably C-shaped spring beams 1512a and 1512d, and 1512b and 1512c to substrate 1508. Device 1500 further comprises two electrodes 1520a and 1520b located below the mirror. Note that in principle the at least one pair of C-shaped (and more generally "pre-curved") beams may comprise only beams 1512a and 1512c, 1512b and 1512d, 1512a and 1512d, or 1512b and 1512c. FIG. 15(d) and (e). FIG. 15(d) show side views of section A—A: (d) shows the C-shaped beams before deformation by the electrostatic force, while (e) shows them after deformation.

When the mirror and one of the electrodes 1520 are charged, the pull on spring beams 1512 (with eccentricity length b) yields a moment causing the rotation of the mirror in the opposite direction around torsion bars 1504 and common axis 1505. Due to the straightening, the C- spring beams have a stiffening type nonlinear characteristics required in order to produce "bouncing effect". It is emphasized that the C-shape springs are used for example only, and that other pre-curved nonlinear stiffness elements, for example V-shape, S-shape or Z-shape may be equally useful for the purposes set forth herein.

Figure 16A:
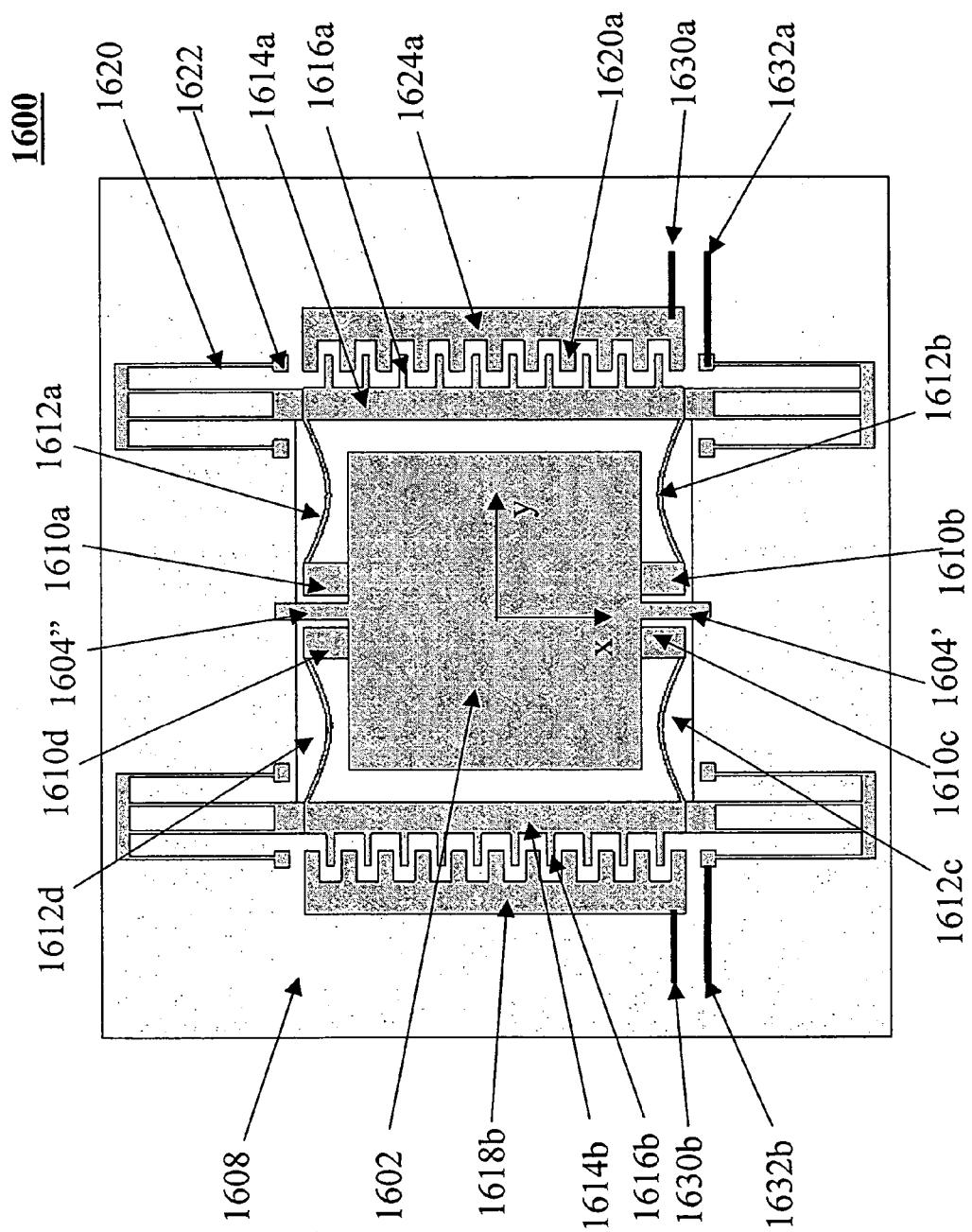
FIG. 16 shows in (a) top view and (b) isomeric view an embodiment of a planar comb drive-actuated bouncing mode mirror device with pre-curved nonlinear stiffness elements.
Figure 16B:
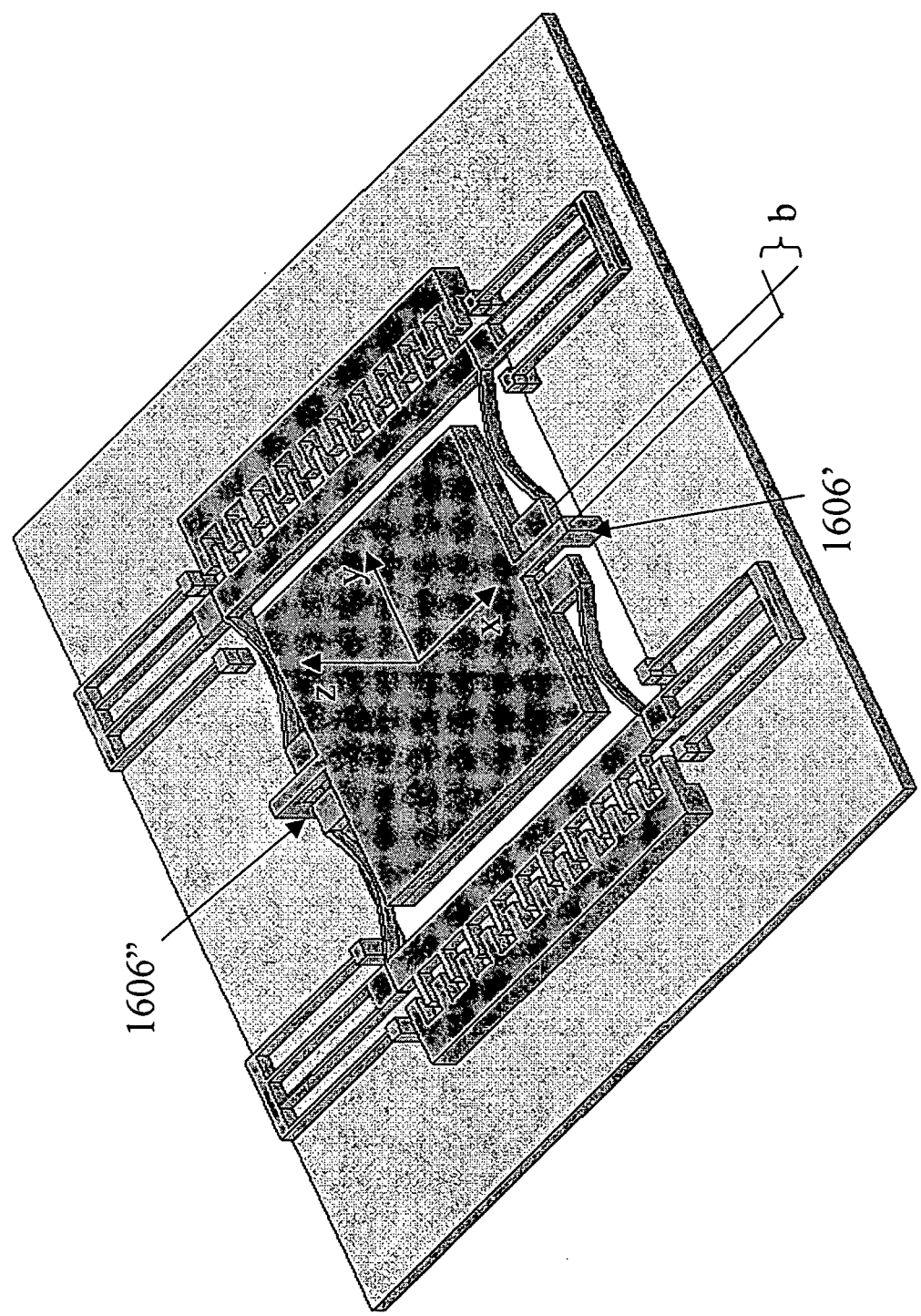

FIG. 16 shows in (a) top view and (b) isomeric view an embodiment of a planar comb drive-actuated bouncing mode mirror device 1600 with pre-curved nonlinear stiffness drive elements actuated by planar comb drives. Device 1600 has elements 1602 to 1610 identical with respective elements 1502 to 1510 in FIG. 15. These include a mirror 1602, two torsion bars 1604' and 1604" elevations 1606' and 1606", substrate 1608, and two pairs of short "offset" beams 1610a and 1610d, and 1610b and 1610c located in a lower part of the mirror, at an offset b from the top surface (FIG. 16b). The offset beams are respectively connected by two pairs of preferably C-shaped spring beams 1612a and 1612d, and 1612b and 1612c to two planar comb drive rotors 1614a and 1614b that have a Y-direction degree of freedom by their connection to substrate 1608 through retaining beam springs 1620 on pads 1622.

When a comb drive stator 1624a with teeth 1620 and a comb drive rotor 1614a with teeth 1616 are charged through electrical conductors 1630a and 1632a, the eccentric pull (with eccentricity length b) yields a counter-clockwise rotation moment of mirror 1602 around torsion bars 1604. Comb drive stator 1618b and comb drive rotor 1614b yield similarly a clockwise rotation of the mirror. The C-spring beams have a nonlinear stiffness designed to transform the movement induced by the comb drives into a linear movement of the mirror (bouncing effect). Is is emphasized that the C-shape springs are used for example only, and that other shape non linear stiffness elements, for example V-shape, S-shape or Z-shape may be equally useful for the purposes set forth herein.

Figure 17A:
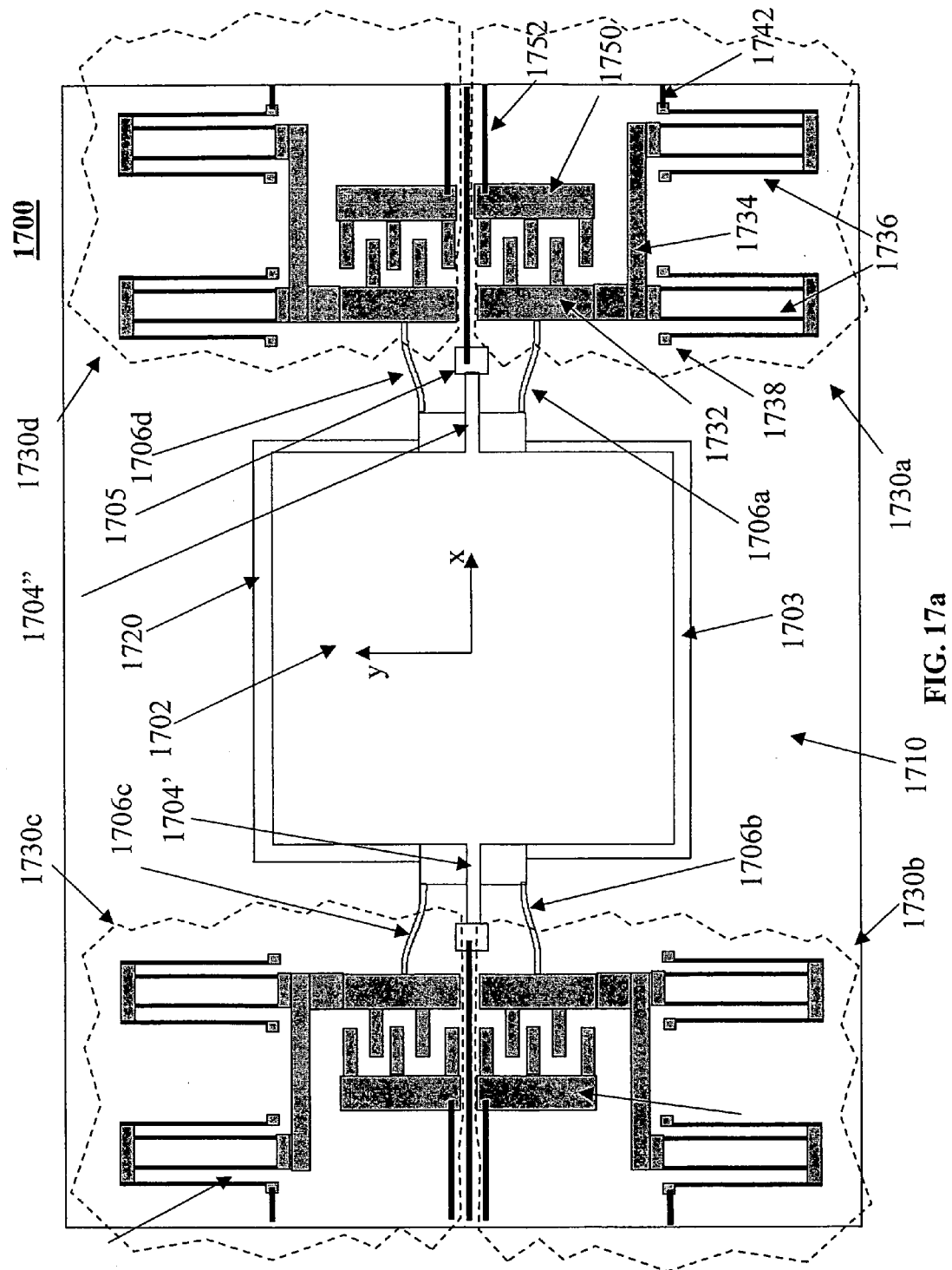
FIG. 17 shows another embodiment of a bouncing mode mirror with in-plane pre-curved nonlinear stiffness elements: (a) top view of the device, (b) top view of the central section with mirror, and c) isomeric view of the mirror section.
Figure 17B:
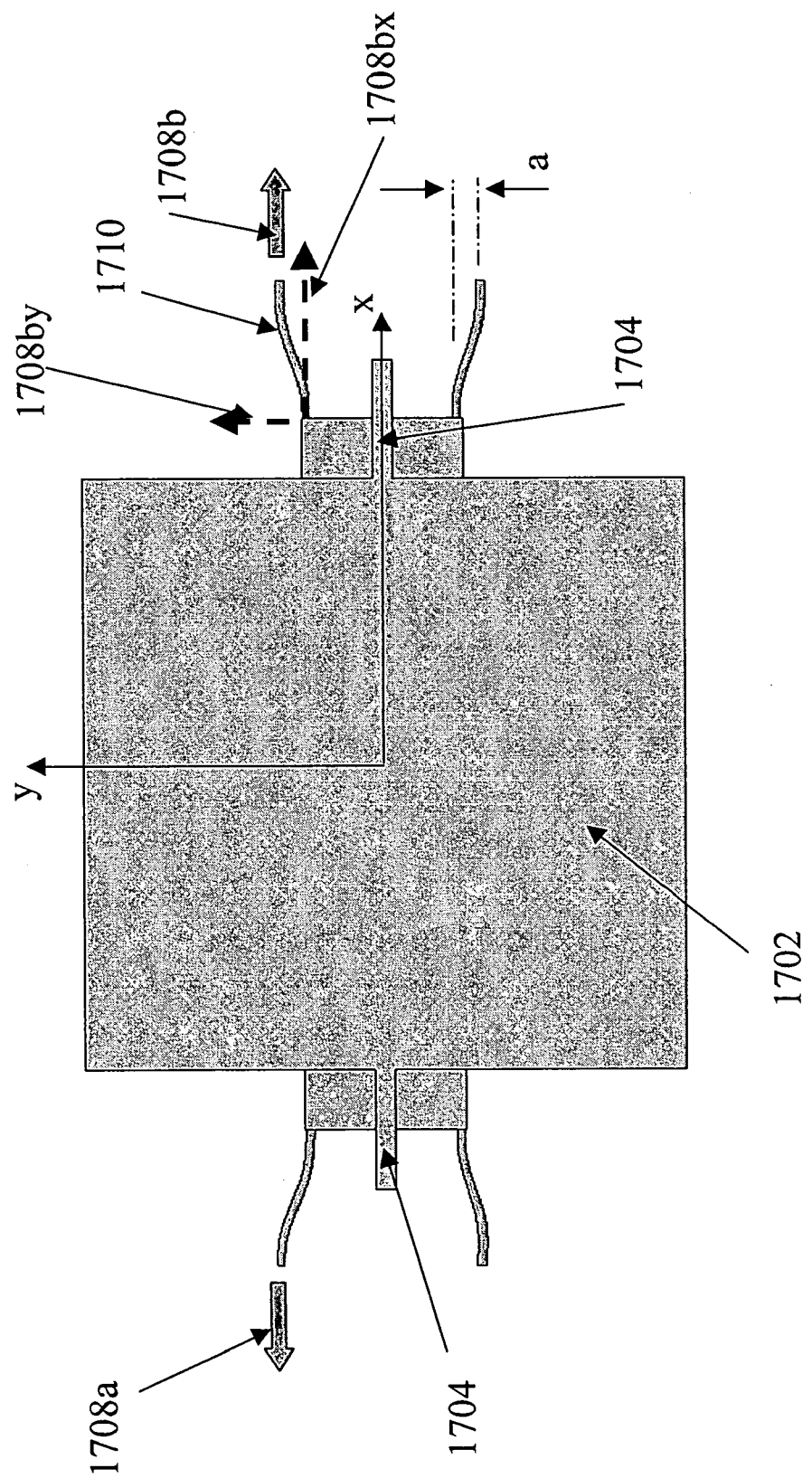
Figure 17C:
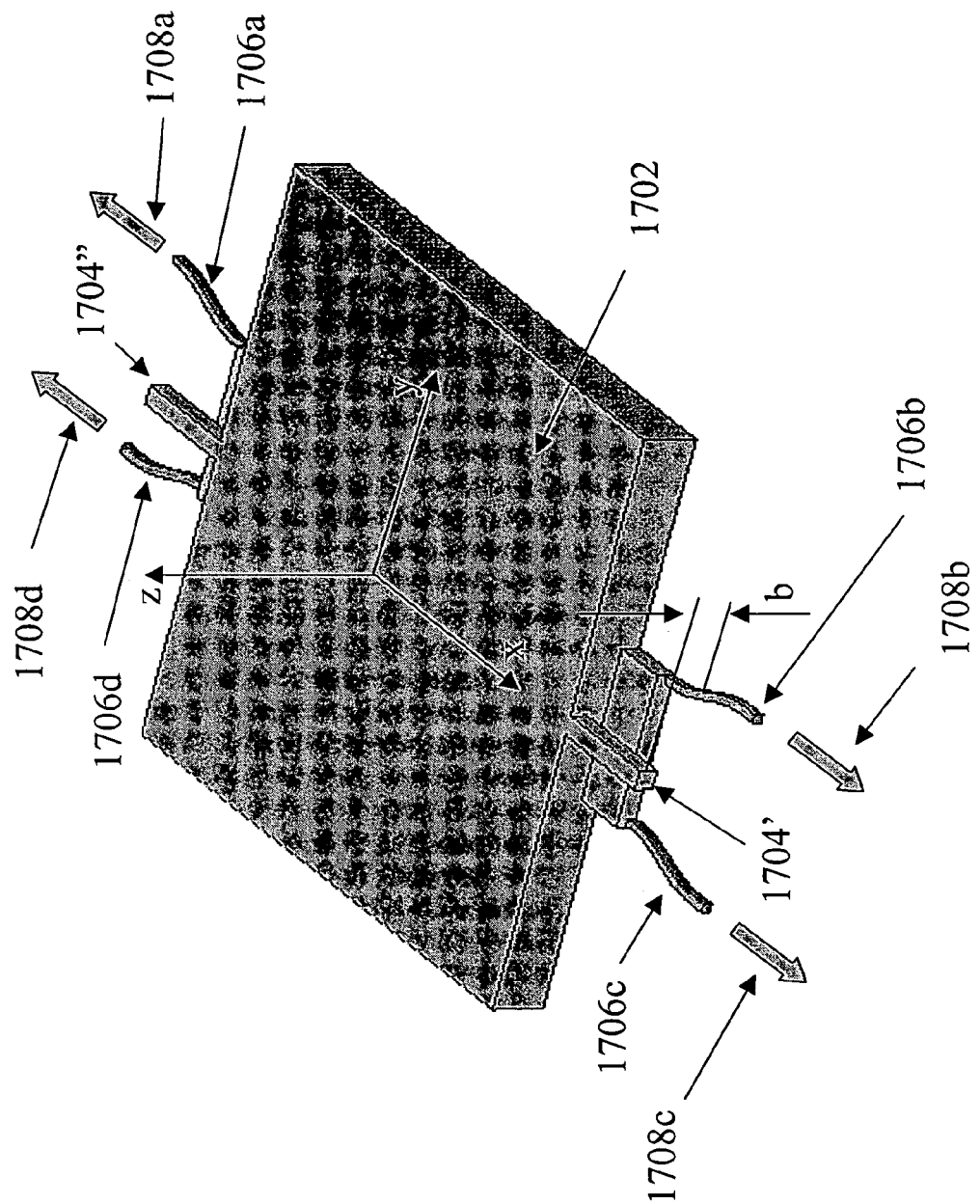

FIG. 17 shows another embodiment of a planar comb driven bouncing mode mirror device 1700 with in-plane pre-curved nonlinear stiffness elements. FIG. 17a shows the entire device, FIG. 17b shows a vector force in the Y direction arising from a pulling force in the X direction. FIG. 17c shows that as a rotation moment around the torsion axis results from the force developed due to the geometry as explained in (b) in combination with the eccentricity b of this force relative to the torsion axis. Device 1700 comprises a mirror 1702 situated in an XY plane and connected by two torsion bars 1704' and 1704" aligned along a common torsion axis in the X direction to a substrate 1710. The mirror is pulled by drivers 1730a and 1730b to the X (and −X) direction either through a pair of curved beams 1706a and 1706b (by forces 1708a and 1708b respectively) or by drivers 1730c and 1730d through a pair 1706c and 1706d curved beams (by forces 1708c, 1708d respectively). When pulled, beams 1706 have a combined action of a nonlinear stiffness element (beam) with a curved-step shape [see 1802b in FIG. 18] with an eccentricity distance 'a'. This eccentricity 25 provides a vertical force vector effect. In addition, the pulling of an opposite pair of curved beams creates a force (e.g. 1708by) in plane XY that is vertical to the pulling force vector (e.g. 1708bx). In other words, the Y direction force vector is eccentric in the Z direction by a distance 'b' to the rotation axis 1704, creating a torsional moment around the rotation axis.

A driver (e.g. 1730a) includes a rotor 1732 pulled by a stator 1750. The rotor has a X- direction degree of freedom as it is fixed to a carrier beam 1734. The carrier beam is connected to two four-beam flexures 1736 anchored to substrate 1710 at pads 1738. The rotor and stator are charged by conductors 1742 and 1752 respectively.

Figure 18:
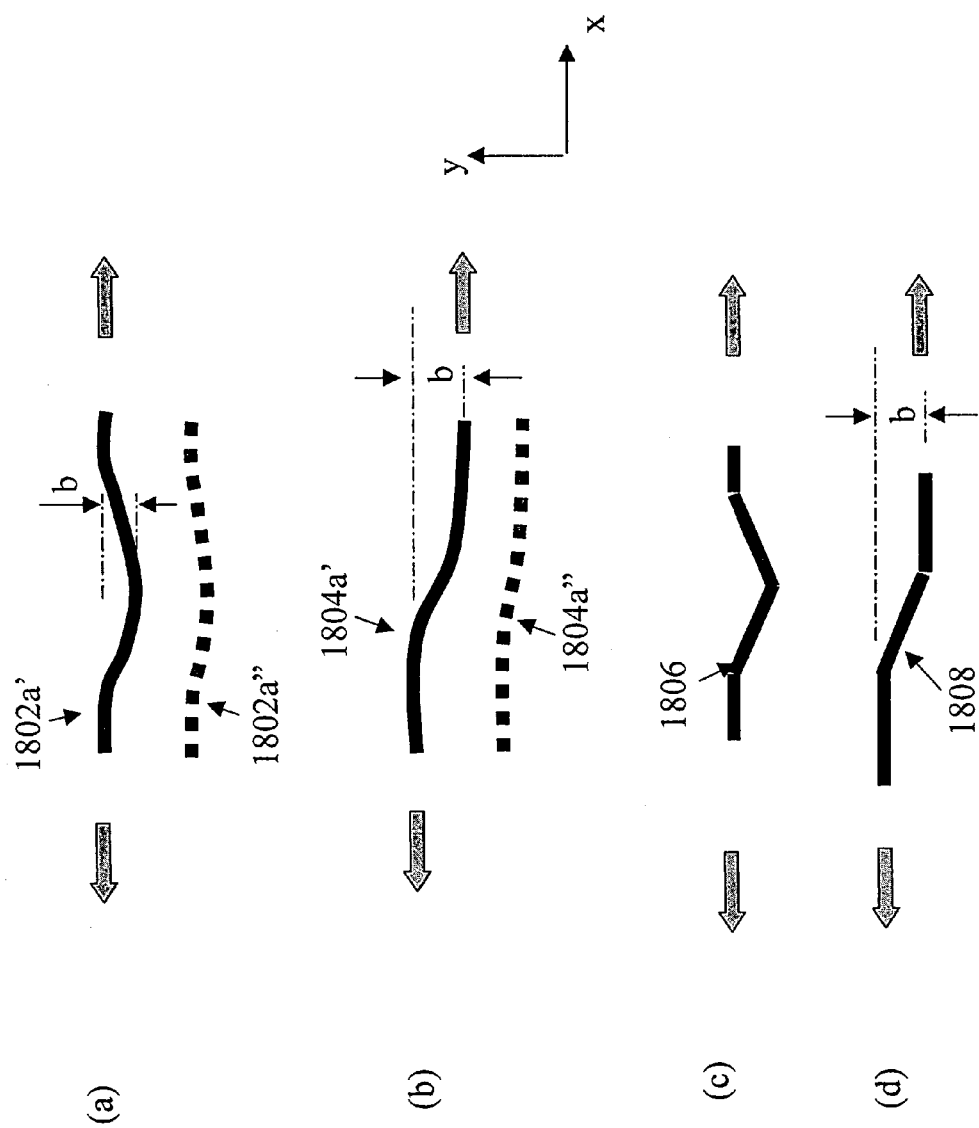
FIG. 18 shows various shapes of pre-curved nonlinear stiffness beams.

FIG. 18 shows various shapes of nonlinear stiffness beams that may be used in the embodiments of FIGS. 15, 16, and 17. These include (but are not limited to) a C-shaped beam 1802 shown in (a), an S-shaped beam 1804 shown in (b), a V-shaped beam 1806 shown in (c) and a Z-shaped beams 1808 shown in (d). In each such beam, the application of a force (shown by arrows) changes the beam curvature and shape, from a state a' to a state b' (shown for simplicity only for the C and S-shaped curves as 1802a', a" and 1804a', a").

FIG. 19 shows an embodiment of a vertical comb drive actuated bouncing mode micro-mirror device 1900. FIG. 19a shows an isomeric view, while FIG. 19b shows some details of that view. Device 1900 comprises a mirror 1902 connected through torsion springs (axis) 1904 to a layer 1906 in which the mirror is fabricated. The mirror has four arms 1908a–d, which together with respective teeth 1910 form comb drive rotors. The device further comprises stator comb drives 1914a–d. For simplicity only set d is shown in FIG. 19b. In use, the activation of comb drive rotors 1908a and 1908b through conductive pads 1925a and 1925b on respective stators 1914a and 1914b causes rotation of the mirror around torsion axes 1904. To reverse direction, comb drive rotors 1908c and 1908d are activated by conductive pads 1925c, 1925d on stators 1914c and 1914d. The rotors themselves are charged through a conductive pad 1927. Device 1900 further comprises at least one pair of bouncing spring beams 1916a, b that are connected each to a respective rotor arm 1908a, b (and through it to the mirror). Additional pairs of bouncing springs (e.g. 1916 c, d) may be connected to rotor arms 1908c, d. When the mirror is rotated around torsion axis 1904, beams 1916 contact stoppers (not shown, but located for example on the handle layer) at the end of the mirror rotation, causing the bouncing effect. In principle, the operation and bouncing effect in this embodiment are similar to those of the embodiment in FIG. 13. The mirror is situated substantially above a release hole 1929.

Figure 19A:
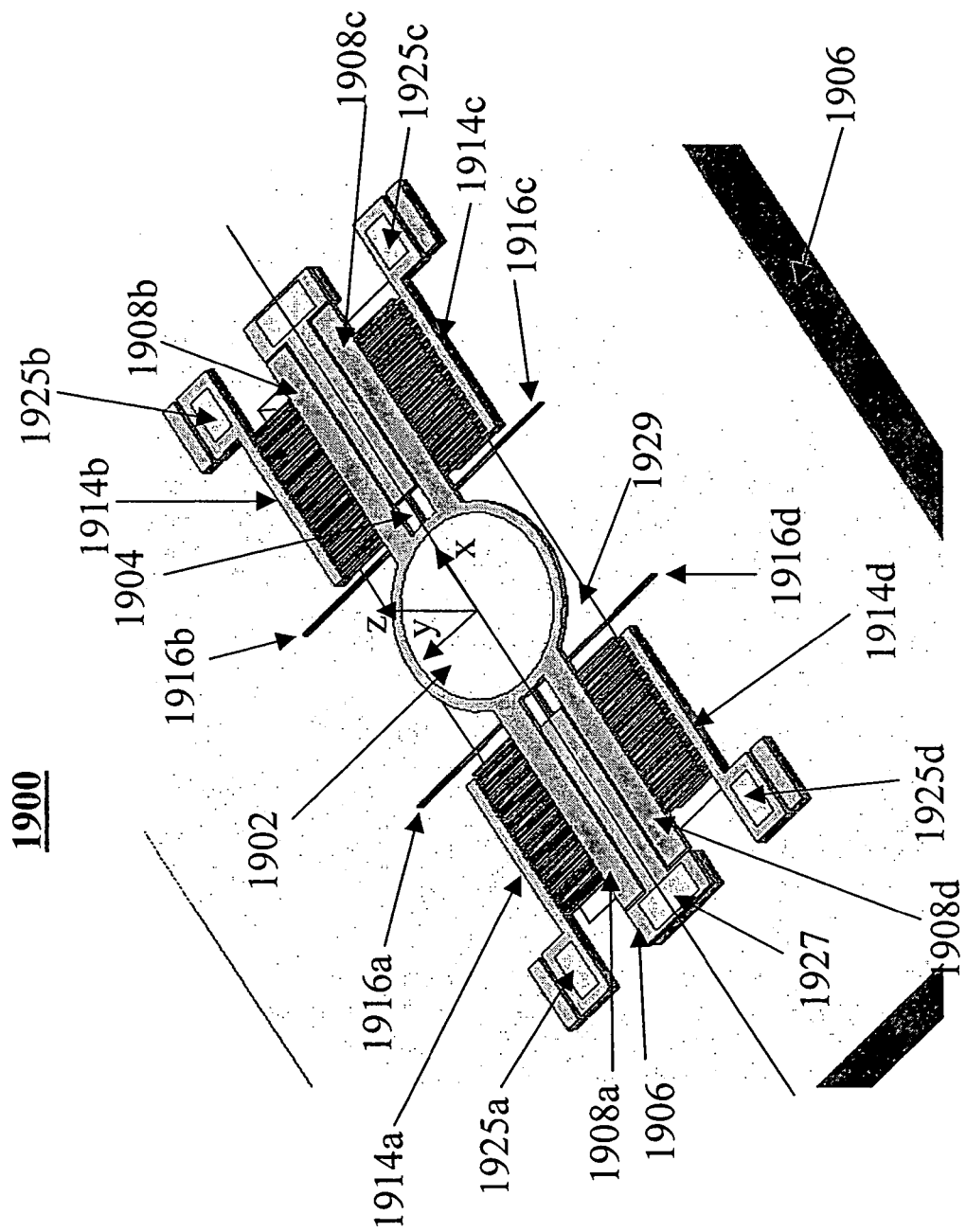
FIG. 19 shows a detailed embodiment of a vertical comb drive actuated bouncing mode micro-mirror with bouncers: (a) general view, (b) enlargement.
FIGS. 19c–e show yet another embodiment of a vertical comb drive actuated bouncing mode micro-mirror device according to the present invention.
Figure 19B:
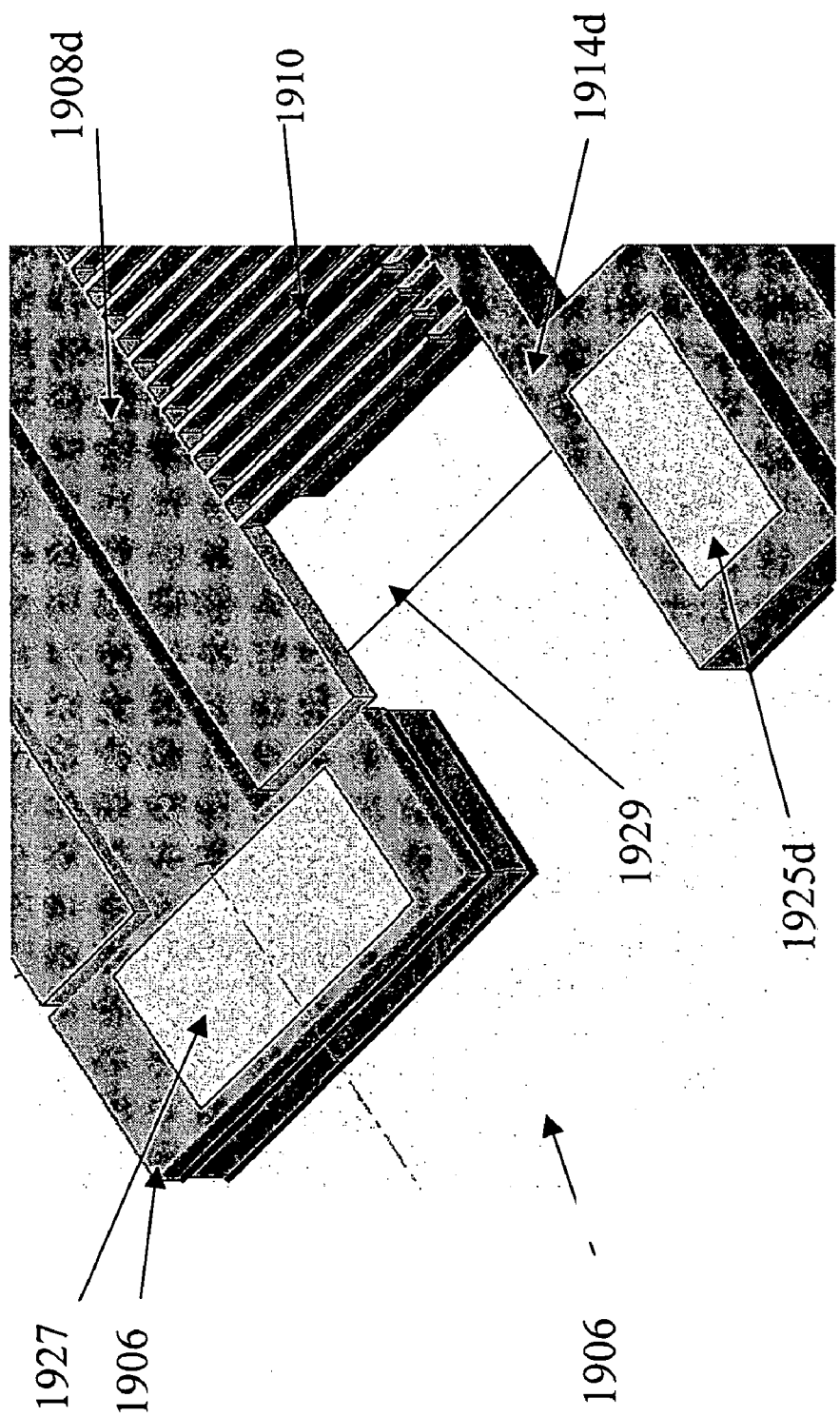
Figure 19C:
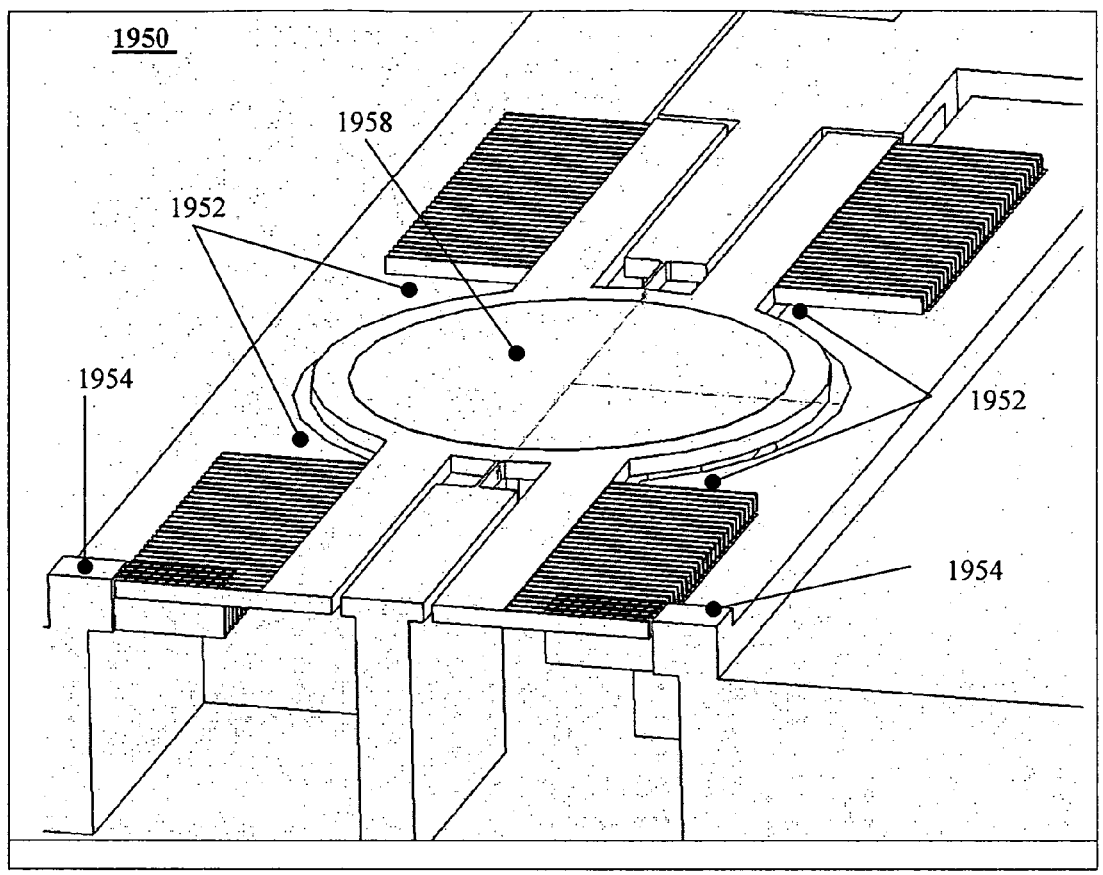
Figure 19D:
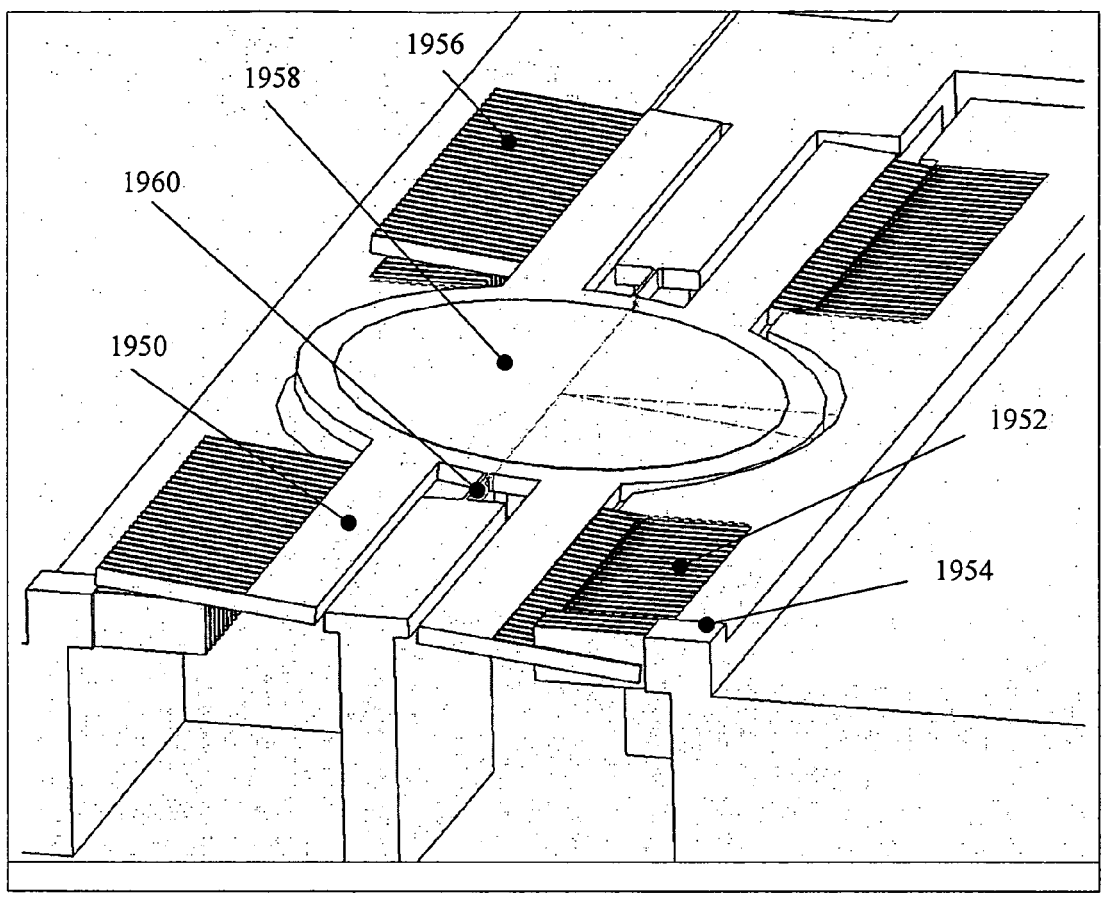

FIGS. 19c–d show yet another embodiment of a vertical comb drive actuated bouncing mode micro-mirror device according to the present invention. This embodiment uses two sets of stationary (stator) combs (stator), one functioning as a bouncing mechanism. FIG. 19c shows a micro-mirror device 1950 with a first set of stators 1952 located in the bottom device layer (see below "second active layer" 2006, FIG. 20). A second set of stationary stator combs 1954 is formed in the upper device layer (see below "first active layer" 2002, FIG. 20). Movable rotor combs 1956 are formed in the same plane (first active layer) with the second stator combs 1954 and with a mirror 1958.

Figure 19E:
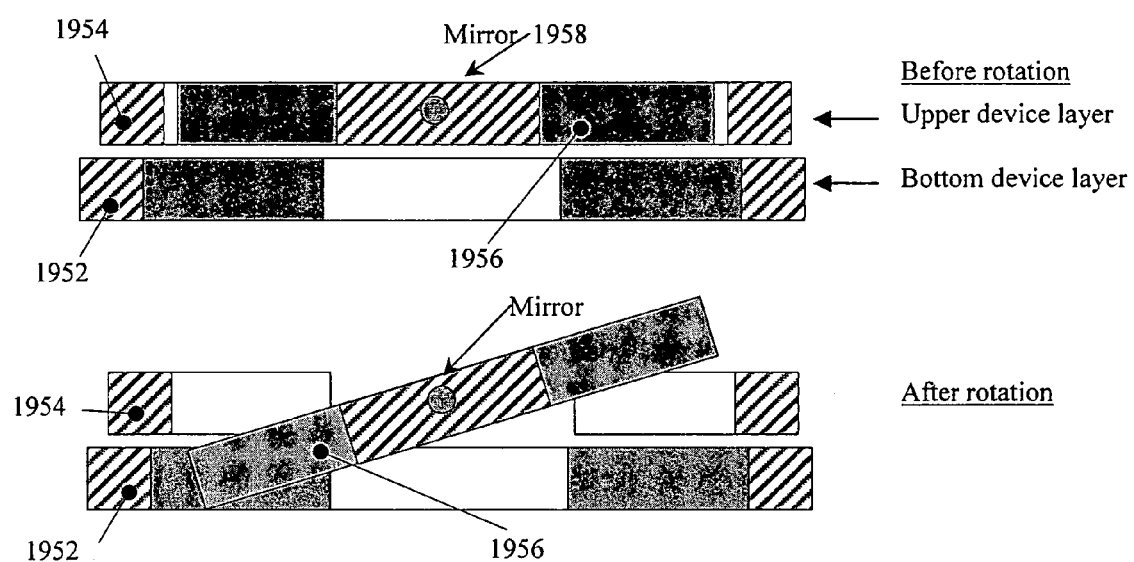

As shown in FIGS. 19d and 19e, the electrostatic force (moment) applied to the mirror by stator combs 1952 tilts the mirror up to a maximal angle (e.g. 10 degrees). When the mirror is in the maximal angle position, the rotor combs attached to the mirror are located within the area of bottom layer stationary combs 1952 (right side of FIG. 19d). On the opposite side of a mirror axis 1960, the movable combs are levitated in such a way that they are located just above or with some overlap with the upper device layer (i.e. with stator combs 1954, see left side of FIG. 19d). The additional set of stationary combs 1954 etched in the upper device layer acts now as a bouncing mechanism that can apply a moment in the direction opposite to the tilt of the mirror when the mirror is in the maximal angle position. This moment leads to a high angular acceleration of the mirror necessary for the achievement of the triangular signal. In traditional vertical comb drive configurations, when the mirror is at the maximal angle position, the combs are located far outside of the comb area and application of the moment in the opposite direction requires very high voltages. In the present invention, the "double active layer stator" structure provides the necessary "bouncing effect" for the mirror, contributing to a linear range of the complete movement.

Fabrication Process

The micro-mirrors can be manufactured using two SOI wafers bonded or fused together, an SOI wafer bonded or fused to a regular Si wafer, or using a special double-active-layer SOI wafer. An exemplary fabrication process of a bouncing mode tilting micro-mirror using a double-active-layer SOI wafer is shown in FIG. 20.

Inventively, the present invention uses a "double-active-layer" SOI wafer in an accurate fabrication process that does not require wafer bonding. The backside etches are aligned to the initial hard mask etch, as described in FIG. 21. The more accurate the processing steps and the alignment between layer features, the higher the precision functionality of the final devices.

FIG. 20 shows a representation of the initial double-active-layer SOI wafer prior to processing. The figure shows a first active layer 2002, a first sacrificial layer 2004, a second active layer 2006, a second sacrificial layer 2008, a silicon substrate 2010, and a third sacrificial layer 2012. Third sacrificial layer 2012 is used for patterning the areas that will be removed underneath the mirror and actuators. The three semiconductor layers, first active layer 2002, second active layer 2006, and substrate 2010 are electrically isolated from one another by layers of sacrificial material (silicon dioxide). First sacrificial layer 2004 is located between the first and second active layers, and second sacrificial layer 2008 is located between the second active layer and the substrate. Each active layer may have a thickness of a few to a few tens of microns.

FIG. 21 (steps a–y) shows details of a process used for fabricating a bouncing mode electrostatic tilting micro-mirror using the wafer construction shown in FIG. 20. The process begins in (a) with deposition of a blank metal layer 2102. The metal is then patterned in (b) using a photoresist mask 2104 and a wet etch is used in (c) to form a mirror metal 2106 and electrical contact pads 2108 for the electrostatic actuator's rotor fingers. A low-pressure chemical vapor deposition (LPCVD) silicon dioxide layer 2110 is then deposited over the metal on the topside of the wafer, in (d). This oxide layer is used both to protect the metal and to form a hard mask for the silicon active layers. The oxide layer is then patterned and etched in (e). The wafer is flipped over, and a photoresist layer 2112 is patterned on the backside in (f) and aligned to the pattern in (e). The third sacrificial layer is etched with reactive ion etching (RIE) in (g), and the photoresist is stripped and a new layer 2114 of photoresist is deposited and patterned in (h). In (i), the third sacrificial layer is etched for a second time using the previously patterned photoresist. The substrate is then etched with a deep RIE (DRIE) process to a typical depth of 50 microns in (j). FIG. 21(k) and (l) show respectively the backside photoresist being stripped, and another layer of photoresist 2116 being applied. Resist 2116 is patterned in (m), and the substrate is etched in (n) using DRIE until the second sacrificial layer is reached. The second sacrificial layer is etched with RIE in (o), and the DRIE is completed when both the second and third sacrificial layers are reached. In FIG. 21(q), the wafer is flipped over again and optionally placed on a carrier wafer 2130. Also highlighted are the back etches 2132 formed in step (p, q) that allow for mirror movement. A photoresist layer 2140 is spun on the topside in (r), and shown patterned in (s). The first active layer is then etched with DRIE until the second sacrificial layer is reached in (t). In FIG. 21(u), the second sacrificial layer is etched with RIE. A DRIE etch is then used to etch about halfway, i.e. typically 25 microns, through the second active layer in (v). At this point photoresist layer 2140 is stripped and a DRIE etch is used to etch until the first and second sacrificial layers are reached in respectively maskless places, as shown in (w). In the final step, FIG. 21(x), the carrier wafer is removed from the backside of the wafer, the wafer is diced and the sacrificial layers, along with the deposited LPCVD oxide hard mask, are etched in hydrofluoric acid (HF). At this point the rotor fingers 2142 and bouncer spring 2144, stator fingers 2146, and mirror 2150 can be more clearly seen. As the HF etches the first sacrificial layer, the second active layer sections 2148 that remained underneath the rotor fingers fall away from the device between the stator fingers.

The invention described above facilitates the formation of a triangular output signal for a scanning mirror and other devices by a single element (bouncer or pre-curved nonlinear stiffness element) having a stiffness nonlinearity (in the case of the bouncer a combined nonlinear stiffness with the rest of the system). The dependence of resonant frequency on the signal amplitude (and therefore voltage) permits its tuning in a very large range. In a parallel plate actuated embodiment, the mirror can be very close to an electrode when it contacts the bouncer without exhibiting pull-in, since the stiffness of the bouncer is very high. The proximity of the electrode permits to develop very large forces. The bouncer transfers attractive electrostatic forces to repelling forces, so that the mirror is actually driven by pulses.

Electrostatic Tilting Mirror Implemented in a Double SOI Substrate

The double active layer SOI substrate of FIG. 20 may be also inventively used to fabricate a "regular", generalized MEMS based electrostatic tilting micro-mirror, including a mirror without a bouncing mechanism, as clearly described in U.S. Provisional Patent application No. 60/550,850 dated 8 Mar. 2004, which is incorporated herein by reference. The tilting mechanism uses vertical comb drives. The use of the double-active layer SOI wafer enables an accurate fabrication process that does not require wafer bonding. The backside etches are aligned to the initial hard mask etch, as described above with reference to FIG. 21. The more accurate the processing steps and the alignment between layer features necessarily mean higher precision functionality of the final devices.

Figure 22A:
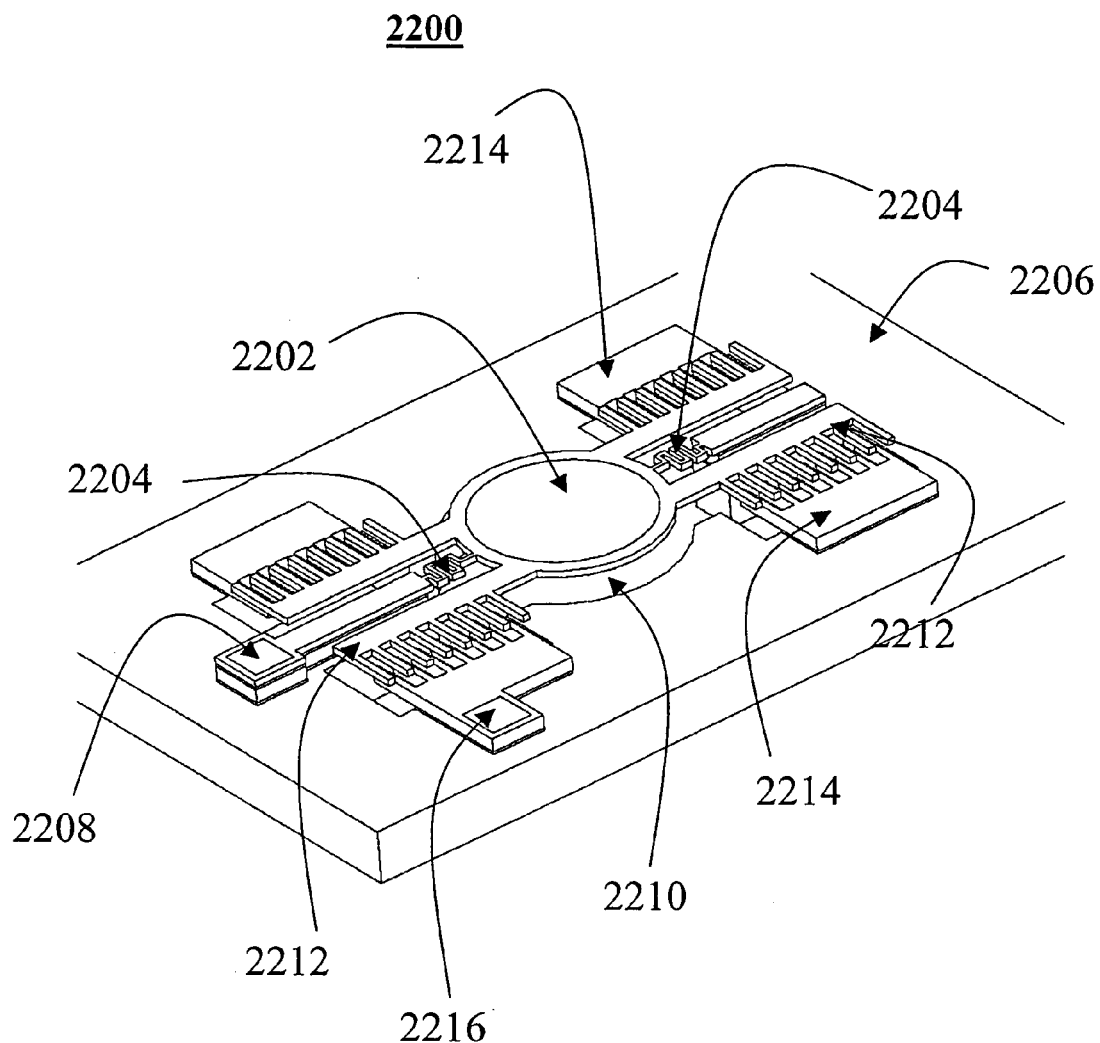
FIG. 22 shows in (a) an isometric view of an electrostatic tilting mirror device implemented in a double SOI substrate; (b) a more detailed view of the vertical offset between the vertical comb drive rotor and stator fingers.
Figure 22B:
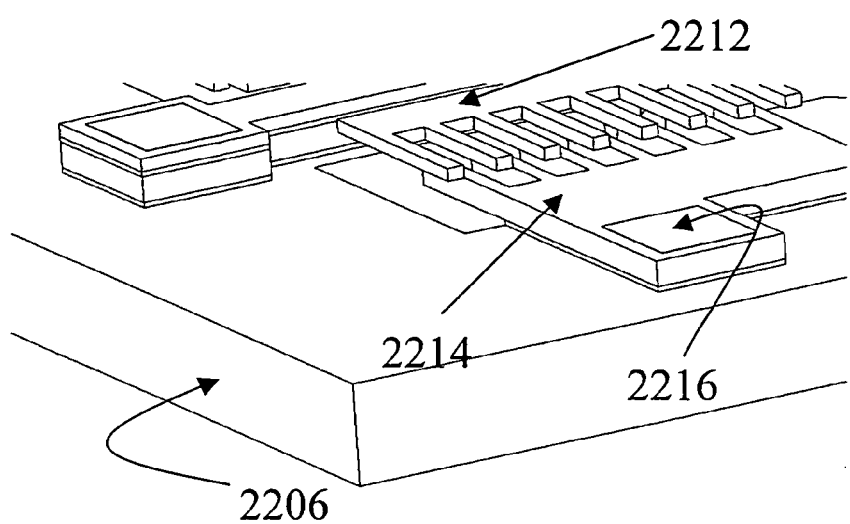

An isometric view of an electrostatic tilting mirror device 2200 implemented in a double SOI substrate is shown in FIG. 22a. Device 2200 comprises many elements in common with device 1900 of FIG. 19, and its process overlaps that described in FIG. 21, except for the bouncing mechanism/stiffness elements processes. Therefore, only the essential differences are described herein in detail. Device 2200 comprises a mirror 2202 suspended between two mechanical torsional springs 2204 which are anchored to a substrate 2206. At least one of springs 2204 anchors is coupled to an electrical contact pad with an applied metal area 2208. The material below (backside of) mirror 2202 is removed (e.g. etched) to provide a space 2210 that allows tilting of the mirror. The electrostatic actuator that tilts the mirror includes rotor fingers 2212 that are coupled to the mirror and stator fingers 2214 that are anchored to substrate 2206. The vertical offset between the rotor fingers and the stator fingers is more clearly seen in FIG. 22b. Attached to the anchored stator fingers is an electrical contact pad 2216 for providing actuating power to the actuators. Note the position of the interdigitated fingers of rotor 2212 and stator 2214 in relation to the mirror and springs 2204. The mirror and rotor 2212 are fabricated in the first active layer (2002 in FIG. 20). The stator is fabricated in the second active layer (2006 in FIG. 20). The third sacrificial layer (2012 in FIG. 20) is used for patterning the areas that need to be removed to form a release hole underneath the mirror and actuators.

To emphasize, a double active layer SOI wafer is used to implement a tilting mirror device driven by electrostatically actuated vertical comb drives. The comb fingers are coupled to the mirror whose motion is stabilized and restricted by the mechanical springs that dually act to return the mirror to its initial position. The mirror and coupled rotor fingers are suspended above a cavity to allow for unimpeded motion. Utilizing a single wafer for the fabrication of these MEMS devices decreases the chances of alignment errors that will occur with the multiplicity of process steps required.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A MEMS apparatus for scanning an optical beam comprising:
   a. a mirror operative to perform a rotational motion to a maximum rotation angle around a mirror rotation axis; and
   b. a bouncing mechanism operative to provide a bouncing event and to reverse said rotational motion, wherein said bouncing mechanism includes at least one first comb drive stator; whereby said bouncing event provides said mirror with a piecewise linear response to actuation by intrinsically nonlinear forces.

2. The MEMS apparatus for scanning an optical beam of claim 1, further comprising an actuator operative to provide said actuation, said actuator connected to a substrate.

3. The MEMS apparatus for scanning an optical beam of claim 2, wherein said actuator includes a vertical comb drive actuator having at least one second comb drive stator in a different plane from a plane of said first comb drive stator.

4. The MEMS apparatus for scanning an optical beam of claim 2, wherein said substrate includes a double active layer silicon-on-insulator (SOI) substrate, wherein each said first comb drive stator is fabricated in a different active layer than each said second comb drive stator.

5. The MEMS apparatus for scanning an optical beam of claim 3, wherein said vertical comb drive actuator includes at least one rotor co-planar with and rigidly connected to said mirror.

6. A MEMS apparatus for scanning an optical beam comprising:
   a. a double active layer silicon-on-insulator (DSOI) substrate having a first active Si layer, a substrate Si layer and a second active Si layer intermediate between said first active Si layer and said substrate Si layer;
   b. a mirror formed in said first active Si layer and operative to perform a tilting motion to a maximum tilting angle around a mirror rotation axis; and
   c. a vertical comb drive actuator having a first comb drive actuator element formed in said second active Si layer and operative to provide said tilting motion.

7. The MEMS apparatus for scanning an optical beam of claim 6, wherein said vertical comb drive includes at least one rotor co-planar with and rigidly connected to said mirror in one said first active Si layer, and at least one stator formed in said second active Si layer.

8. The MEMS apparatus for scanning an optical beam of claim 6, further comprising at least a pair of springs connecting said mirror on opposite sides to said substrate.

9. A tilting micro-mirror formed in a double active layer silicon-on-insulator (DSOI) substrate having, in order, a stacked structure of a first active Si layer, a second active Si layer and a substrate Si layer and actuated by a vertical comb drive formed in the same DSOI substrate, wherein said vertical comb drive includes at least one rotor formed in said first active Si layer and at least one stator formed in said second active Si layer.

10. The micro-mirror of claim 9, wherein said mirror is formed in the same active layer as said at least one rotor.

11. A method for controlling the path of a light beam reflected by a reflecting element formed in a double active layer silicon-on-insulator (DSOI) substrate having, in order, a stacked structure of a first active Si layer, a second active Si layer and a substrate Si layer, the method comprising the steps of:
   a. providing at least one vertical comb drive having comb-drive elements formed in both active Si layers of said DSOI substrate; and b. using said at least one vertical comb drive to tilt said reflecting element, thereby controlling said light beam path.

12. The method of claim 11, wherein said step of providing at least one vertical comb drive formed in said DSOI substrate includes:
   i. providing at least one movable comb drive element rigidly connected to said reflecting element and formed in said first active Si layer, and
   ii. providing at least one stationary comb drive element formed in said second active Si layer, said movable and stationary comb drive elements being electrostatically actuated to provide said tilt.

13. The method of claim 12, further comprising the step of providing at least one additional stationary comb drive element formed in the same active layer as said reflecting element and said movable comb drive element, said at least one additional stationary comb drive element operative to provide a bouncing event to said reflective element.

14. A MEMS apparatus for scanning an optical beam formed in a double active layer silicon-on-insulator (DSOI) substrate that includes, in order, a stacked structure of a first active Si layer, a second active Si layer and a substrate Si layer, the apparatus comprising:
   a. a micro-mirror formed in said first active Si layer; and
   b. a vertical comb drive operative to impart a tilting motion to said micro-mirror and comprising a rotor and a first stator, wherein said rotor is formed entirely and solely in said first active Si layer and said first stator is formed entirely and solely in said second active Si layer.

15. The MEMS apparatus for scanning an optical beam of claim 14, wherein said rotor and said first stator have respective rotor and stator interfaces with rotor and stator cavities formed in said substrate.

16. The MEMS apparatus for scanning an optical beam of claim 15, wherein said rotor cavity extends through said second active Si layer and said substrate Si layer and wherein said stator cavity extends through said substrate Si layer.

17. The MEMS apparatus for scanning an optical beam of claim 15, wherein said vertical comb drive further comprises a second stator formed in said first active Si layer.

18. The MEMS apparatus for scanning an optical beam of claim 15, wherein said rotor is rigidly attached to said micro-mirror by a torsional member, and wherein said micro-mirror and said torsional member have respective interfaces with micro-mirror and torsional member cavities extending through said second active Si layer and said substrate Si layer.

19. A method for forming a scanning micro-mirror in a double active silicon-on-insulator (DSOI) substrate that includes, in order, a stacked structure of a first active Si layer, a second active Si layer and a substrate Si layer, the method comprising the steps of:
   a. forming a micro-mirror in said first active Si layer; and
   b. forming a vertical comb drive operative to impart a tilting motion to said micro-mirror, said vertical comb drive comprising a rotor and a stator, wherein said rotor is formed entirely and solely in said first active Si layer and wherein said stator is formed entirely and solely in said second active Si layer.

20. The method of claim 19, wherein said forming of said rotor entirely and solely in said first active Si layer is achieved by removing second active Si layer and substrate Si layer sections bounding said rotor, and wherein said forming of said stator entirely and solely in said second active Si layer is achieved by removing substrate Si layer sections bounding said stator.

* * * * *